(12) United States Patent
Tashiro et al.

(10) Patent No.: US 11,931,995 B2
(45) Date of Patent: Mar. 19, 2024

(54) BONDING METHOD AND BONDING APPARATUS

(71) Applicant: Tokyo Electron Limited, Tokyo (JP)

(72) Inventors: Kei Tashiro, Koshi (JP); Katsuhiro Iino, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/145,107

(22) Filed: Dec. 22, 2022

(65) Prior Publication Data

US 2023/0278322 A1  Sep. 7, 2023

(30) Foreign Application Priority Data

Dec. 24, 2021 (JP) .................................. 2021-211374

(51) Int. Cl.
*B32B 37/08* (2006.01)
*B32B 37/06* (2006.01)

(52) U.S. Cl.
CPC .............. *B32B 37/08* (2013.01); *B32B 37/06* (2013.01)

(58) Field of Classification Search
CPC ................................ B32B 37/08; B32B 37/06
See application file for complete search history.

(56) References Cited

U.S. PATENT DOCUMENTS

2006/0154443 A1* 7/2006 Horning .................. B81C 3/001
  438/455
2014/0338813 A1* 11/2014 Ookawa .................. B32B 37/10
  156/60

FOREIGN PATENT DOCUMENTS

| JP | 2001064041 | A | * | 3/2001 |
| JP | 2004047670 | A | * | 2/2004 |
| JP | 2011174108 | A | * | 9/2011 |
| JP | 2013-065677 | A | | 4/2013 |
| JP | 2014027118 | A | * | 2/2014 |
| JP | 2016039299 | A | * | 3/2016 |

OTHER PUBLICATIONS

JP2001064041A Machine Translation of Description (Year: 2023).*
JP2016039299A Machine Translation of Description (Year: 2023).*
JP2011174108A Machine Translation of Description (Year: 2023).*
JP2004047670A Machine Translation of Description (Year: 2023).*
JP2014027118A Machine Translation of Description (Year: 2023).*

* cited by examiner

*Primary Examiner* — Cynthia L Schaller
(74) *Attorney, Agent, or Firm* — Pearne & Gordon LLP

(57) ABSTRACT

A bonding method includes attracting and holding a first substrate by using a first holder; attracting and holding a second substrate by using a second holder; and forming a combined substrate by moving the first holder and the second holder relative to each other to bring the first substrate and the second substrate into contact with each other. The bonding method includes heating the first substrate and the second substrate or the combined substrate; and cooling the heated combined substrate by using a cooling unit. In the cooling, bending of the combined substrate is controlled by forming a temperature difference in the combined substrate.

11 Claims, 17 Drawing Sheets

US 11,931,995 B2

BONDING METHOD AND BONDING APPARATUS

CROSS-REFERENCE TO RELATED APPLICATION

This application claims the benefit of Japanese Patent Application No. 2021-211374 filed on Dec. 24, 2021, the entire disclosure of which is incorporated herein by reference.

TECHNICAL FIELD

The various aspects and embodiments described herein pertain generally to a bonding method and a bonding apparatus.

BACKGROUND

Patent Document 1 describes a bonding method of bonding a processing target substrate and a support substrate, which are respectively attracted to and held by a first holder and a second holder disposed to face each other, by pressing the second holder against the first holder in the state that each substrate is heated by a heating mechanism of each holder.

Patent Document 1: Japanese Patent Laid-open Publication No. 2013-065677

SUMMARY

In one exemplary embodiment, a bonding method includes attracting and holding a first substrate by using a first holder; attracting and holding a second substrate by using a second holder; and forming a combined substrate by moving the first holder and the second holder relative to each other to bring the first substrate and the second substrate into contact with each other. The bonding method includes heating the first substrate and the second substrate or the combined substrate; and cooling the heated combined substrate by using a cooling unit. In the cooling, bending of the combined substrate is controlled by forming a temperature difference in the combined substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
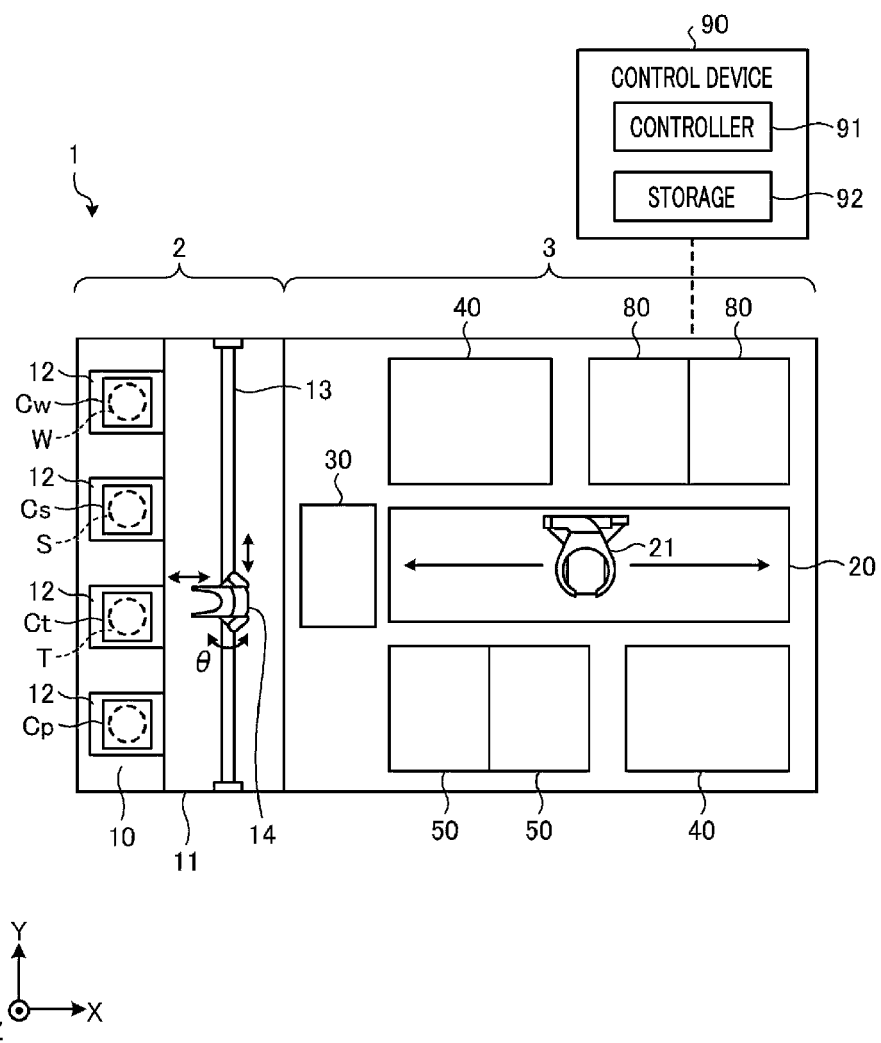
FIG. 1 is a schematic plan view illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments for a bonding method and a bonding apparatus according to the present disclosure (hereinafter, referred to as "exemplary embodiments") will be described in detail with reference to the accompanying drawings. It should be noted that the present disclosure is not limited by the exemplary embodiments. Further, unless processing contents are contradictory, the various exemplary embodiments and modification examples can be appropriately combined. Furthermore, in the various exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as θ direction.

Figure 2:
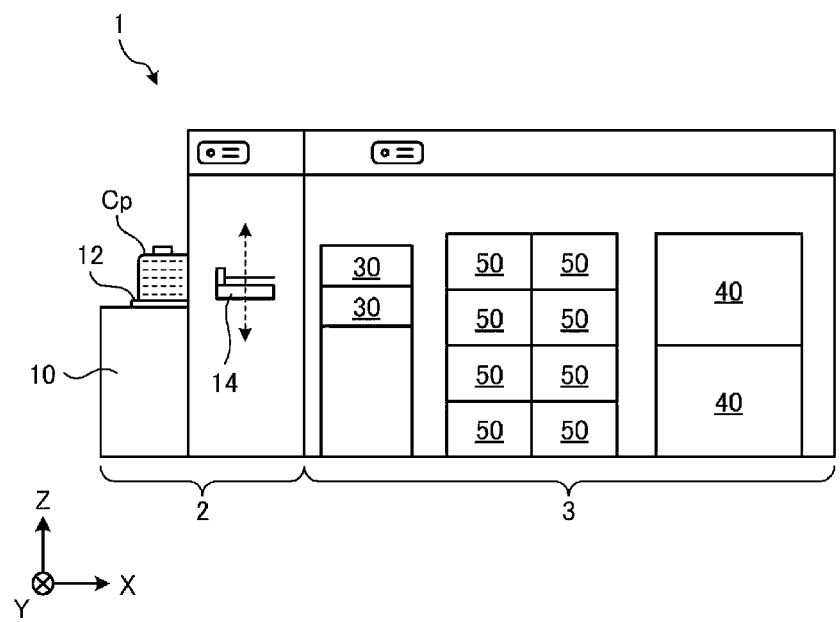
FIG. 2 is a schematic side view illustrating the configuration of the bonding system according to the exemplary embodiment.
Figure 3:
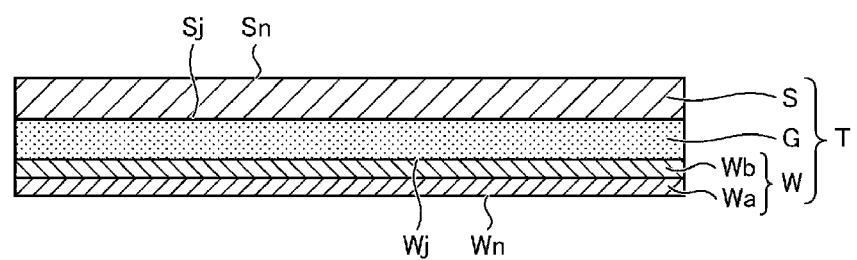
FIG. 3 is a schematic side view of a combined substrate according to the exemplary embodiment.

First, referring to FIG. 1 to FIG. 3, a bonding system 1 according to an exemplary embodiment will be described. FIG. 1 is a schematic plan view illustrating a configuration of the bonding system according to the exemplary embodiment. FIG. 2 is a schematic side view illustrating the configuration of the bonding system according to the exemplary embodiment. FIG. 3 is a schematic side view of a combined substrate according to the exemplary embodiment.

The bonding system 1 shown in FIG. 1 and FIG. 2 forms a combined substrate T by bonding a processing target substrate W and a support substrate S with an adhesive G therebetween, as illustrated in FIG. 3. The processing target substrate W is an example of a first substrate, and the support substrate S is an example of a second substrate.

The processing target substrate W includes, for example, a glass substrate Wa, and a resin layer Wb formed on the glass substrate Wa. A plurality of electronic circuits may be previously formed on a surface of the glass substrate Wa on which the resin layer Wb is to be formed. Among plate surfaces of the processing target substrate W, the plate surface facing the support substrate S will be referred to as "bonding surface Wj," and the plate surface opposite to the bonding surface Wj will be referred to as "non-bonding surface Wn." The bonding surface Wj is a front surface of the resin layer Wb, and the non-bonding surface Wn is a front surface of the glass substrate Wa. After the processing target substrate W and the support substrate S are bonded, the glass substrate Wa is thinned by a polishing process.

For example, the resin layer Wb is formed by coating a resin composition on the glass substrate Wa and heating the coated resin composition. Afterwards, the resin layer Wb is cooled to a room temperature.

In the process of cooling the resin layer Wb after the formation of the resin layer Wb, the processing target substrate W may be bent due to a difference in thermal expansion between the resin layer Wb and the glass substrate Wa. When the glass substrate Wa is used as a base material of the resin layer Wb, the difference in thermal expansion between the resin layer Wb and the base material is large, as compared to a case where a silicon substrate or the like is used instead of the glass substrate Wa. As a result, the processing target substrate W is bent largely.

In the present exemplary embodiment, a heating unit 130 configured to heat the processing target substrate W before the processing target substrate W and the support substrate S are bonded is provided within a bonding apparatus 80, as will be described later. Therefore, the bending which has occurred in the process of cooling the resin layer Wb after the formation thereof can be reduced immediately before the bonding is performed. As a result, precision of position alignment between the processing target substrate W and the support substrate S in a horizontal direction, which is performed immediately before the bonding, can be improved, so that bonding precision can be improved.

The support substrate S is a substrate having substantially the same diameter as the processing target substrate W, and serves to support the processing target substrate W. As the support substrate S, a glass substrate or the like is used, for example. Among plate surfaces of the support substrate S, the plate surface facing the processing target substrate W will be referred to as "bonding surface Sj," and the plate surface opposite to the bonding surface Sj will be referred to as "non-bonding surface Sn."

The adhesive G is, for example, a thermosetting resin-based adhesive. Thermosetting refers to a property of a substance that is difficult to transform at a room temperature (e.g., about 20° C.) but is softened by heating so as to be molded easily, and is polymerized and hardened by further heating so as not to return to its original state. As an example of the adhesive G, one having a softening temperature of about 120° C. to 140° C. and a curing temperature of about 180° C. is used. The adhesive G may have a multi-structure.

As shown in FIG. 1, the bonding system 1 includes a carry-in/out station 2 and a processing station 3. The carry-in/out station 2 and the processing station 3 are connected as one body in this order in the positive X-axis direction.

The carry-in/out station 2 has a cassette placing table 10 and a first transfer region 11. The cassette placing table 10 is a place where cassettes Cw, Cs and Ct, each of which accommodates therein a plurality (for example, 25 sheets) of substrates horizontally, are disposed. By way of example, four placing units 12 are arranged in a row in the carry-in/out station 2. For example, the cassette Cw accommodating therein the processing target substrate W, the cassette Cs accommodating therein the support substrate S, and the cassette Ct accommodating therein the combined substrate T are respectively placed in the placing units 12. In addition to the cassettes Cw, Cs and Ct, a cassette Cp for collecting a defective substrate, for example, may also be disposed in the placing unit 12.

Disposed in the first transfer region 11 are a transfer path 13 extending in the Y-axis direction and a first transfer device 14 configured to be movable along the transfer path 13. The first transfer device 14 is movable in the X-axis direction as well as in the Y-axis direction and pivotable around the Z-axis, and serves to transfer the processing target substrate W, the support substrate S, and the combined substrate T between the cassettes Cw, Cs, and Ct placed in the placing units 12 and a transition apparatus 30 of a processing station 3 to be described later.

The processing station 3 is equipped with a second transfer region 20, the transition apparatus 30, a coating apparatus 40, a heat treatment apparatus 50, and the bonding apparatus 80. The transition apparatus 30, the coating apparatus 40, the heat treatment apparatus 50, and the bonding apparatus 80 are arranged around the second transfer region 20. The layout and the number of these apparatuses may be selected as required.

Disposed in the second transfer region 20 is a second transfer device 21. The second transfer device 21 is movable in the X-axis direction, the Y-axis direction and the Z-axis direction and is pivotable around the Z-axis, and serves to transfer the processing target substrate W, the support substrate S and the combined substrate T between the transition apparatus 30, the coating apparatus 40, the heat treatment apparatus 50, and the bonding apparatus 80.

The transition apparatus 30 is disposed between the first transfer region 11 and the second transfer region 20. The first transfer device 14 and the second transfer device 21 transfer the processing target substrate W, the support substrate S, and the combined substrate T via the transition apparatus 30. The transition apparatus 30 is equipped with a cooling unit configured to cool the combined substrate T, which will be elaborated later. In addition, although the cooling unit is included in the transition apparatus 30 in the present exemplary embodiment, the cooling unit may be provided separately from the transition apparatus 30.

The coating apparatus 40 coats the adhesive G on the bonding surface Sj of the support substrate S. The heat treatment apparatus 50 heats the support substrate S coated with the adhesive G at a predetermined temperature to vaporize an organic solvent contained in the adhesive G. The bonding apparatus 80 bonds the processing target substrate W and the support substrate S with the adhesive G therebetween.

The bonding system 1 is equipped with a control device 90. The control device 90 is, for example, a computer, and includes a controller (CPU (Central Processing Unit)) 91 and a storage 92 such as a memory. The storage 92 stores therein a program for controlling various processings performed in the bonding system 1. The control device 90 controls an operation of the bonding system 1 by causing the controller 91 to execute the program stored in the storage 92.

Now, referring to FIG. 1 and FIG. 2, an operation of the bonding system 1 will be described briefly. First, in the bonding system 1, the cassette Cw accommodating therein a plurality of processing target substrates W, the cassette Cs accommodating therein a plurality of support substrates S, and the empty cassette Ct are placed in the placing unit 12 of the carry-in/out station 2.

Then, the first transfer device 14 takes out the support substrate S from the cassette Cs and transfers it to the transition apparatus 30 of the processing station 3. At this time, the support substrate S is transferred with the bonding surface Sj facing upwards. The support substrate S transferred to the transition apparatus 30 is taken out from the transition apparatus 30 by the second transfer device 21 and then conveyed to the coating apparatus 40.

Next, the coating apparatus 40 coats the adhesive G on the bonding surface Sj of the support substrate S. Thereafter, the support substrate S is taken out from the coating apparatus 40 by the second transfer device 21 and then transferred to the heat treatment apparatus 50.

Subsequently, the heat treatment apparatus 50 heats the support substrate S to a predetermined temperature. As a result, the organic solvent contained in the adhesive G coated on the support substrate S is vaporized. The adhesive G from which the organic solvent has been vaporized is hardened to such an extent that it does not fall off even if the support substrate S is tilted. Thereafter, the support substrate S is taken out from the heat treatment apparatus 50 by the second transfer device 21 and then transferred to the bonding apparatus 80.

While the above-described processing is being performed, the processing target substrate W is taken out from the cassette Cw by the first transfer device 14 and transferred to the transition apparatus 30 of the processing station 3. At this time, the processing target substrate W is transferred with the bonding surface Wj facing upwards. The processing target substrate W transferred to the transition apparatus 30 is taken out from the transition apparatus 30 by the second transfer device 21 and then transferred to the bonding apparatus 80.

Once the carry-in of the processing target substrate W and the support substrate S into the bonding apparatus 80 is completed, the processing target substrate W and the support substrate S are bonded by the bonding apparatus 80, so that the combined substrate T is formed.

Next, the combined substrate T is taken out from the bonding apparatus 80 by the second transfer device 21, and then transferred to the transition apparatus 30 to be cooled by the cooling unit of the transition apparatus 30. Thereafter, the combined substrate T is taken out from the transition apparatus 30 by the first transfer device 14 and accommodated in the cassette Ct. In this way, the bonding processing including the above-described series of operations is finished.

Figure 4:
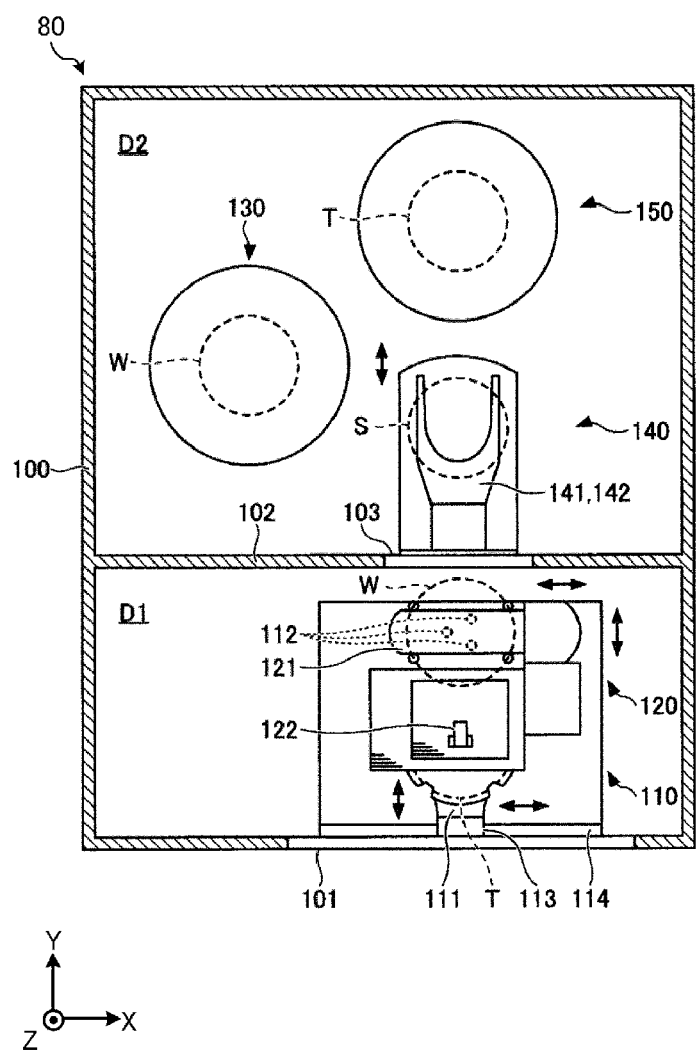
FIG. 4 is a schematic plan view of a bonding apparatus according to the exemplary embodiment.

Now, referring to FIG. 4, an example of the bonding apparatus 80 will be explained. FIG. 4 is a schematic plan view of the bonding apparatus 80 according to the exemplary embodiment.

As depicted in FIG. 4, the bonding apparatus 80 includes a processing vessel 100 having a hermetically sealable inside. A carry-in/out opening 101 through which the processing target substrate W, the support substrate S and the combined substrate T pass is formed at a side surface of the processing vessel 100 near the second transfer section 20. An opening/closing shutter (not shown) is provided at this carry-in/out opening 101.

An inner wall 102 that partitions the interior of the processing vessel 100 into a pre-processing region D1 and a bonding region D2 may be provided within the processing vessel 100. A carry-in/out opening 103 through which the processing target substrate W, the support substrate S and the combined substrate T pass is formed at the inner wall 102, and a non-illustrated opening/closing shutter is provided at the carry-in/out opening 103.

Provided in the pre-processing region D1 is a delivery unit 110 configured to deliver the processing target substrate W, the support substrate S and the combined substrate T to and from the outside of the bonding apparatus 80. The delivery unit 110 is disposed adjacent to the carry-in/out opening 101.

The delivery unit 110 is equipped with a delivery arm 111 and supporting pins 112. The delivery arm 111 delivers the processing target substrate W, the support substrate S and the combined substrate T between the second transfer device 21 (see FIG. 1) and the supporting pins 112. The supporting pins 112 are provided at a plurality of, for example, three positions to support the processing target substrate W, the support substrate S, and the combined substrate T.

As will be described later, the delivery unit 110 may be vertically arranged in multiple levels, for example, in two levels, and may be capable of delivering any two of the processing target substrate W, the support substrate S, and the combined substrate T at the same time. For example, one delivery unit 110 may deliver the processing target substrate W or the support substrate S before being bonded, and the other delivery unit 110 may deliver the combined substrate T after being bonded. Alternatively, one delivery unit 110 may deliver the processing target substrate W before being bonded, and the other delivery unit 110 may transfer the support substrate S before being bonded.

An inverting unit 120 configured to invert, for example, the support substrate S upside down is provided above the delivery unit 110. The inverting unit 120 is equipped with a holding arm 121 configured to hold the processing target substrate W or the support substrate S. The holding arm 121 extends in a horizontal direction (in the X-axis direction in FIG. 4), and is configured to be rotatable about a horizontal axis and movable both in horizontal directions (in the X-axis direction and the Y-axis direction) and a vertical direction (in the Z-axis direction).

In addition, the inverting unit 120 is equipped with an adjusting mechanism configured to adjust the direction of the processing target substrate W or the support substrate S in the horizontal direction. The adjusting mechanism is equipped with a detector 122 configured to detect the position of a notch of the support substrate S or the processing target substrate W. In the inverting unit 120, while moving the support substrate S or the processing target substrate W held by the holding arm 121 in the horizontal direction, the position of the notch of the support substrate S or the processing target substrate W is detected by the detector 122. In this way, the inverting unit 120 adjusts the direction of the support substrate S or the processing target substrate W in the horizontal direction by adjusting the position of the notch.

The heating unit 130 configured to heat the processing target substrate W is provided on the negative X-axis side of the bonding region D2. The heating unit 130 reduces the bending of the processing target substrate W by heating the processing target substrate W.

Provided on the negative Y-axis side of the bonding region D2 is a transfer unit 140 configured to transfer the processing target substrate W, the support substrate S and the combined substrate T to/from the delivery unit 110, the inverting unit 120, the heating unit 130, and a bonding unit 150 to be described later. The transfer unit 140 is disposed adjacent to the carry-in/out opening 103.

The transfer unit 140 is equipped with, for example, a first transfer arm 141 and a second transfer arm 142. The first transfer arm 141 and the second transfer arm 142 are vertically arranged in two levels in this order from the bottom, and are configured to be movable in a horizontal direction and a vertical direction by a non-illustrated driving unit.

The first transfer arm 141 transfers the processing target substrate W or the support substrate S while holding the bottom surface (non-bonding surface Wn) of the processing target substrate W or the bottom surface (non-bonding surface Sn) of the support substrate S, for example. Meanwhile, the second transfer arm 142 transfers the support substrate S after being inverted upside down by the inverting unit 120 while holding a peripheral portion of the bottom surface (bonding surface Sj) of the support substrate S.

The bonding unit 150 configured to bond the processing target substrate W and the support substrate S is disposed on the positive Y-axis side of the bonding region D2. The bonding unit 150 bonds the processing target substrate W and the support substrate S to form the combined substrate T. The formed combined substrate T is transferred from the bonding unit 150 to the delivery unit 110 by the first transfer arm 141 of the transfer unit 140, delivered to the delivery arm 111 via the supporting pins 112, and then delivered to the second transfer device 21 from the delivery arm 111.

Now, an example of the delivery unit 110 will be described with reference to FIG. 5. The delivery unit 110 includes the delivery arm 111 and the supporting pins 112 as described above. The delivery arm 111 serves to deliver the processing target substrate W, the support substrate S, or the combined substrate T between the second transfer device 21 and the supporting pins 112. The supporting pins 112 are provided at a plurality of, for example, three positions to support the processing target substrate W, the support substrate S, or the combined substrate T.

The delivery unit 110 is equipped with an arm driving unit 113. The arm driving unit 113 includes a motor or the like and serves to move the delivery arm 111 in the Y-axis direction. The arm driving unit 113 is moved in the X-axis direction along a rail 114 (see FIG. 4). The delivery arm 111 is movable in horizontal directions (in the X-axis direction and the Y-axis direction). In addition, the arm driving unit 113 may move the delivery arm 111 in the Z-axis direction.

Figure 5:
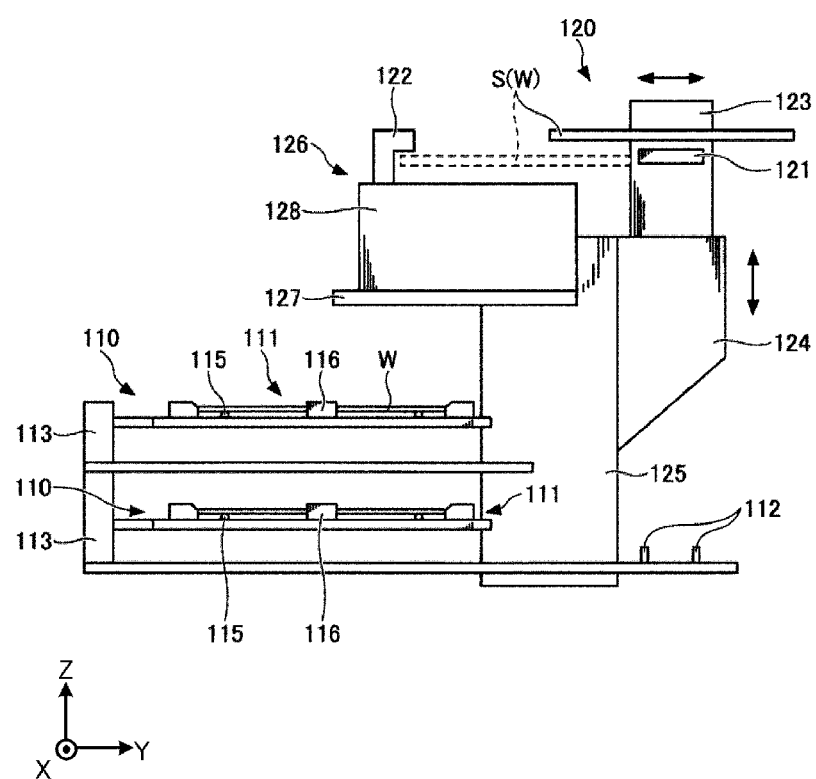
FIG. 5 is a schematic front view of a delivery unit and an inverting unit according to the exemplary embodiment.

As depicted in FIG. 5, a plurality of, for example, four supporting pins 115 for supporting the bottom surface of the processing target substrate W, the support substrate S, or the combined substrate T are provided at, for example, four positions on the delivery arm 111. Further, guides 116 for performing positioning of the processing target substrate W, the support substrate S, or the combined substrate T supported by the supporting pins 115 are also provided on the delivery arm 111. The guides 116 are provided at a plurality of, for example, four positions to guide a side surface of the processing target substrate W, the support substrate S, or the combined substrate T.

The delivery units 110 are vertically arranged in two levels, and the inverting unit 120 is disposed vertically above these delivery units 110. The delivery arm 111 of the delivery unit 110 is moved in a horizontal direction below the holding arm 121 of the inverting unit 120 and the adjusting mechanism 126. Moreover, the supporting pins 112 of the delivery unit 110 are disposed below the holding arm 121 of the inverting unit 120.

Figure 6:
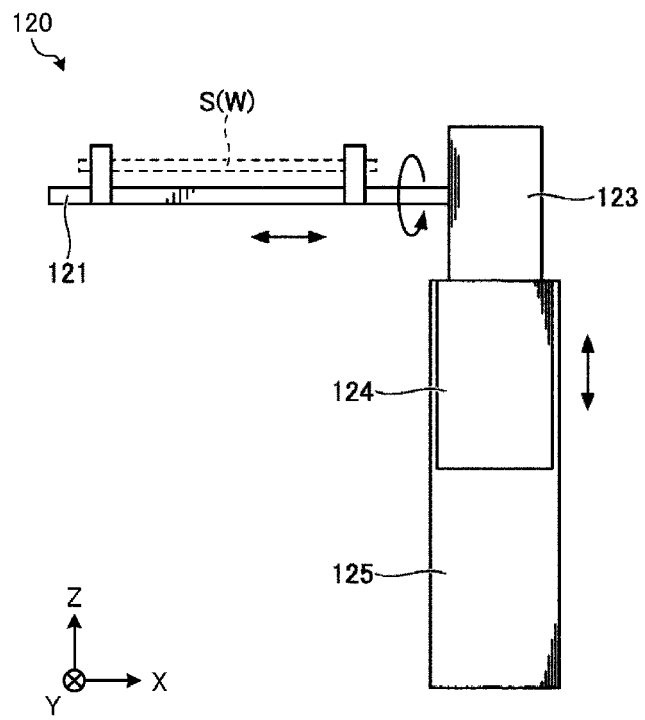
FIG. 6 is a schematic side view of the inverting unit according to the exemplary embodiment.

Now, an example of the inverting unit 120 will be described with reference to FIG. 5 and FIG. 6. The inverting unit 120 is equipped with the holding arm 121 and the detector 122 as stated above. Further, the inverting unit 120 includes a first driving unit 123. The first driving unit 123 includes a motor or the like, and serves to rotate the holding arm 121 about a horizontal axis and move it in horizontal directions (in the X-axis direction and the Y-axis direction). Further, the first driving unit 123 may move the holding arm 121 horizontally by rotating the holding arm 121 about a vertical axis.

A second driving unit 124 including, for example, a motor or the like is provided below the first driving unit 123. The second driving unit 124 moves the first driving unit 123 vertically along a supporting column 125. By the first driving unit 123 and the second driving unit 124, the holding arm 121 can be rotated about the horizontal axis and moved in a horizontal direction and a vertical direction.

An adjusting mechanism 126 is supported by the supporting column 125 with a supporting plate 127 therebetween. The adjusting mechanism 126 is disposed adjacent to the holding arm 121. The adjusting mechanism 126 adjusts the direction of the support substrate S or the processing target substrate W held by the holding arm 121 in the horizontal direction.

The adjusting mechanism 126 has a base 128 and a detector 122. The adjusting mechanism 126 detects the position of the notch of the support substrate S or the processing target substrate W with the detector 122 while moving the support substrate S or the processing target substrate W held by the holding arm 121 in the horizontal direction. In this way, the adjusting mechanism 126 adjusts the direction of the support substrate S or the processing target substrate W by adjusting the position of the notch.

Figure 7:
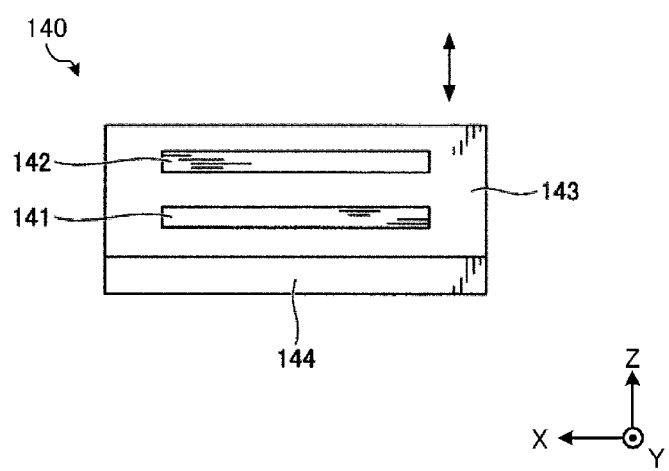
FIG. 7 is a schematic side view of the transfer unit according to the exemplary embodiment.
Figure 8:
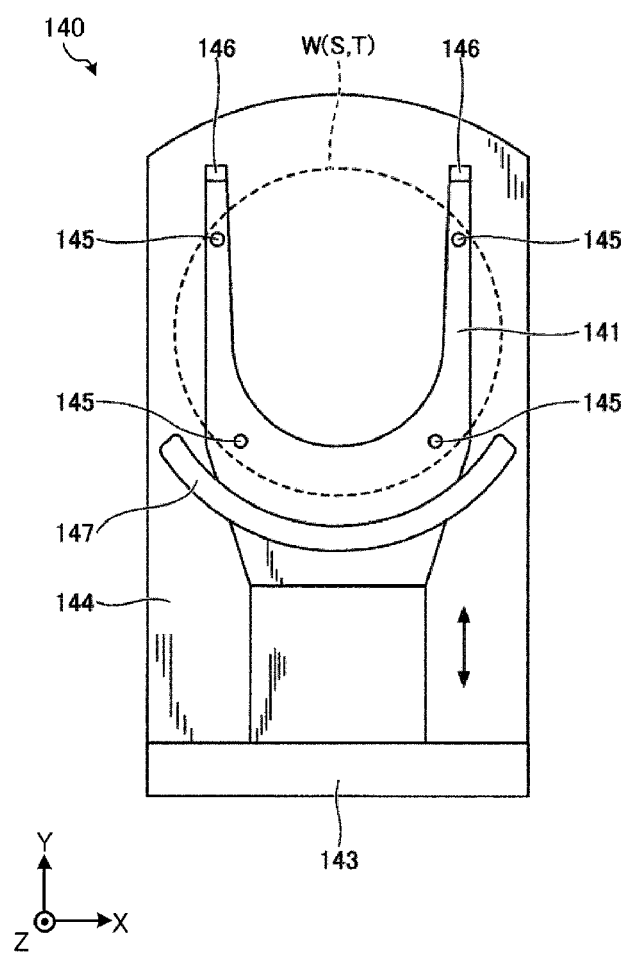
FIG. 8 is a schematic plan view of a first transfer arm belonging to the transfer unit according to the exemplary embodiment.
Figure 9:
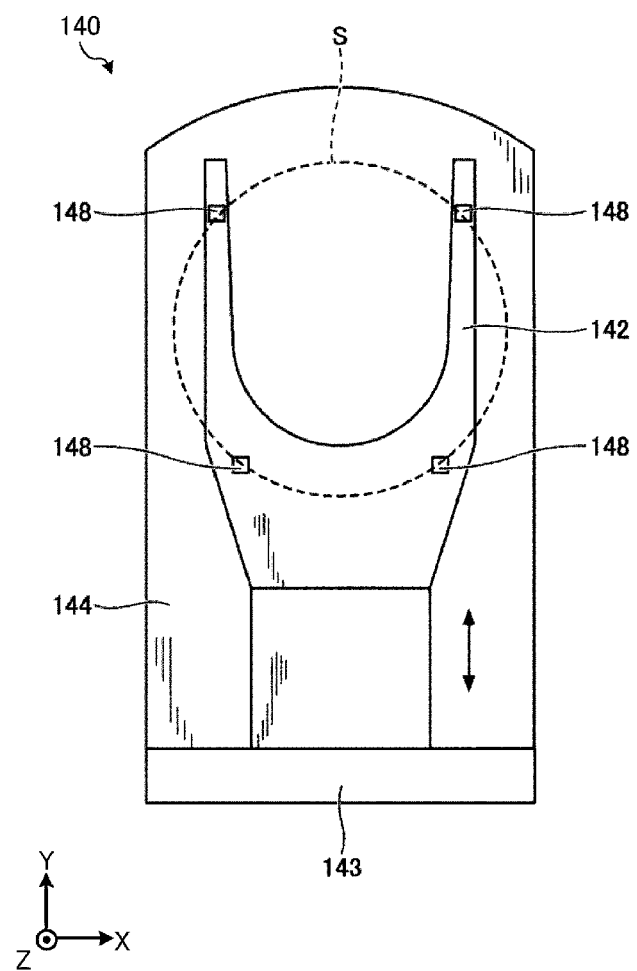
FIG. 9 is a schematic plan view of a second transfer arm belonging to the transfer unit according to the exemplary embodiment.

Now, referring to FIG. 7 to FIG. 9, an example of the transfer unit 140 will be discussed. FIG. 7 is a schematic side view of a transfer unit according to the exemplary embodiment. FIG. 8 is a schematic plan view of a first transfer arm belonging to the transfer unit according to the exemplary embodiment. FIG. 9 is a schematic plan view of a second transfer arm belonging to the transfer unit of the exemplary embodiment.

As illustrated in FIG. 7, the transfer unit 140 is equipped with the first transfer arm 141 and the second transfer arm 142 as stated above. The first transfer arm 141 and the second transfer arm 142 are vertically arranged in two levels in this order from the bottom. The first transfer arm 141 and the second transfer arm 142 may have different shapes as will be described later.

An arm driving unit 143 including, for example, a motor or the like is provided at base ends of the first transfer arm 141 and the second transfer arm 142. The arm driving unit 143 independently moves the first transfer arm 141 and the second transfer arm 142 in a horizontal direction. The first transfer arm 141, the second transfer arm 142 and the arm driving unit 143 are supported by a base 144. The base 144 can be moved in a vertical direction by a driving unit (not shown) including a motor or the like.

As illustrated in FIG. 8, the first transfer arm 141 transfers the processing target substrate W, the support substrate S, or the combined substrate T while holding the bottom surfaces thereof (the non-bonding surface Wn and the non-bonding surface Sn in case of the processing target substrate W and the support substrate S). The first transfer arm 141 has a fork shape with a leading end thereof divided in two.

O-rings 145 made of a resin are provided at a plural of, for example, four positions on the first transfer arm 141. The O-rings 145 are in contact with the bottom surface of the processing target substrate W, the support substrate S, or the combined substrate T, and holds the bottom surface by a frictional force. The first transfer arm 141 holds the processing target substrate W, the support substrate S, or the combined substrate T horizontally on the O-rings 145.

Further, first guides 146 and a second guide 147, for example, are provided on the first transfer arm 141 to be located outside the processing target substrate W, the support substrate S, or the combined substrate T held by the O-rings 145. The first guides 146 are respectively provided at the bifurcated leading ends of the first transfer arm 141. The second guide 147 is formed in an arc shape on the opposite side from the first guides 146 with the processing target substrate W, the support substrate S, or the combined substrate T therebetween. The first guides 146 and the second guide 147 suppress the processing target substrate W, the support substrate S, or the combined substrate T from being deviated from the first transfer arm 141. When the processing target substrate W, the support substrate S, or the combined substrate T is held at an appropriate position by the O-rings 145, the processing target substrate W, the support substrate S, or the combined substrate T is not in contact with the first guides 146 and the second guide 147.

As shown in FIG. 9, the second transfer arm 142 transfers the support substrate S while holding a peripheral portion of the bottom surface (bonding surface Sj) of the support substrate S. That is, the second transfer arm 142 holds the peripheral portion of the bonding surface Sj of the support substrate S inverted upside down by the inverting unit 120 to transfer it. The second transfer arm 142 has a fork shape with a leading end thereof divided in two.

Holders 148 are provided at a plurality of, for example, four positions on the second transfer arm 142. Each holder 148 has a horizontal plane on which the peripheral portion of the bonding surface Sj of the support substrate S is to be placed; and a tapered surface inclined outwards in a diametrical direction of the support substrate S as it goes upwards from the horizontal plane. The tapered surface determines the position of the support substrate S in the horizontal direction. The second transfer arm 142 holds the support substrate S horizontally on the holders 148. The second transfer arm 142 holds the peripheral portion of the bonding surface Sj of the support substrate S. Therefore, contamination of the bonding surface Sj with particles or the like adhering to the second transfer arm 142, for example, can be suppressed.

Figure 10:
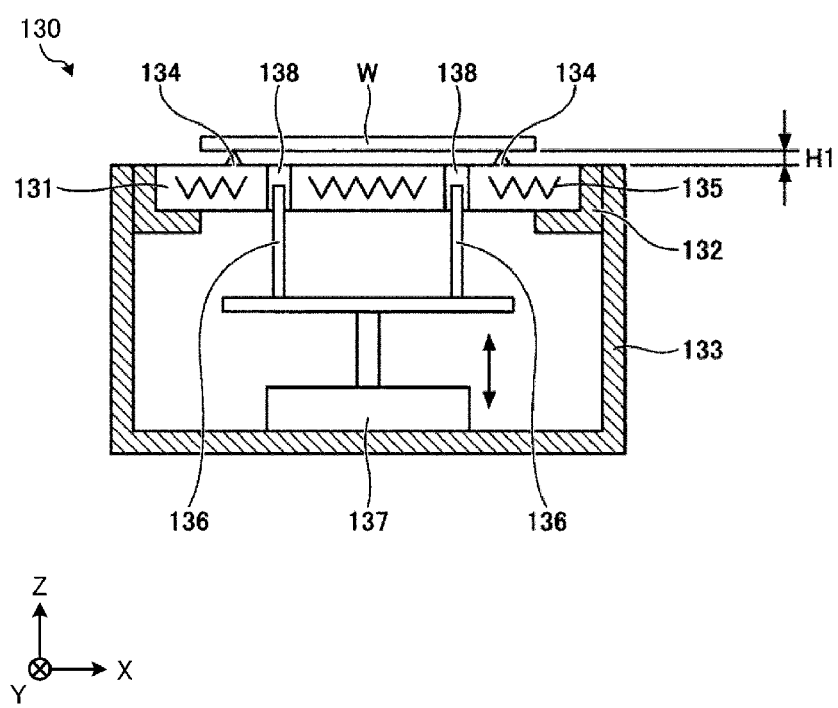
FIG. 10 is a schematic cross sectional view of a heating unit according to the exemplary embodiment.

Next, an example of the heating unit 130 will be described with reference to FIG. 10. The heating unit 130 includes, for example, a hot plate 131, an annular holder 132 that accommodates the hot plate 131 and holds a peripheral portion of the hot plate 131, and a substantially cylindrical support ring 133 surrounding the holder 132.

Supporting pins 134 are provided at a plurality of, for example, three positions on the hot plate 131. The supporting pins 134 support the processing target substrate W and form a gap between the processing target substrate W and the hot plate 131. The gap has a size H1 equal to or larger than, e.g., 0.4 mm.

The hot plate 131 has a substantially disk shape, and serves to heat the processing target substrate W via the supporting pins 134. The hot plate 131 has, for example, a heating mechanism 135 incorporated therein. The heating mechanism 135 includes, for example, a heater. A heating temperature of the hot plate 131 is controlled by, for example, the control device 90 so that the processing target substrate W placed on the hot plate 131 is heated to a preset temperature.

Provided below the hot plate 131 are, for example, three elevating pins 136 for moving the processing target substrate W up and down by supporting the processing target substrate W from below. The elevating pins 136 may be moved up and down by an elevational driving unit 137. Through holes 183 are formed through the hot plate 131 in a thickness direction thereof. The through holes 183 are provided at, for example, three positions near a central portion of the hot plate 131. In addition, the elevating pins 136 are inserted through the through holes 138 so as to be protruded from a top surface of the hot plate 131.

Figure 11:
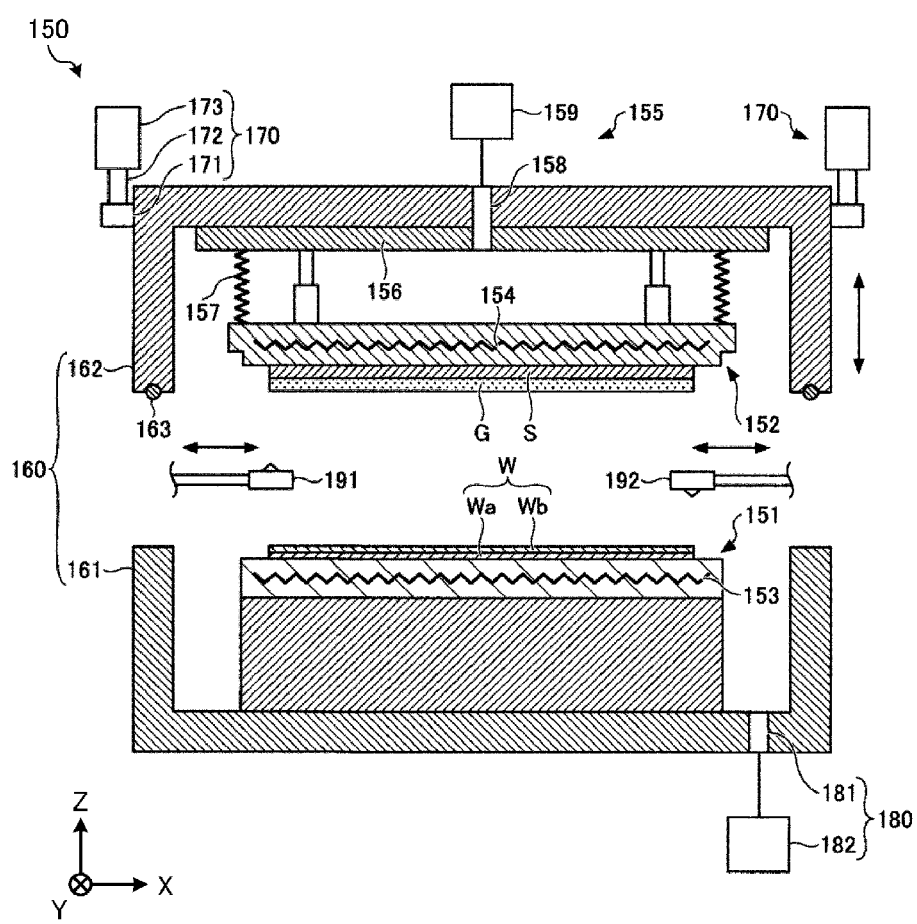
FIG. 11 is a schematic cross sectional view of a bonding unit according to the exemplary embodiment.
Figure 12:
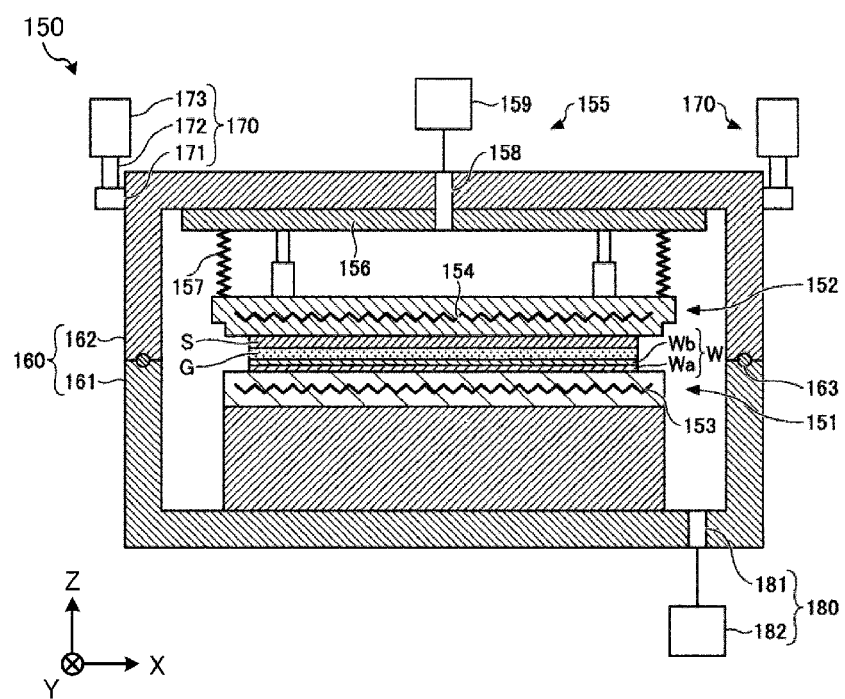
FIG. 12 is a schematic cross sectional view illustrating an operation of the bonding unit according to the exemplary embodiment.

Now, with reference to FIG. 11 and FIG. 12, the bonding unit 150 will be explained. The bonding unit 150 is equipped with a first holder 151, and a second holder 152 disposed above the first holder 151 to face it.

The first holder 151 and the second holder 152 are, for example, electrostatic chucks, and are configured to hold the processing target substrate W and the support substrate S, respectively, by electrostatic attraction. The first holder 151 holds the processing target substrate W from below, and the second holder 152 holds the support substrate S from above. The processing target substrate W and the support substrate S are held by the first holder 151 and the second holder 152 in the state that the bonding surfaces Wj and Sj face each other.

In addition, the first holder 151 and the second holder 152 may be equipped with, in addition to or instead of an electrostatic attracting unit configured to attract the support substrate S and the processing target substrate W electrostatically, a vacuum attracting unit configured to vacuum-attract the support substrate S and the processing target substrate W.

The bonding unit 150 is equipped with a first heating mechanism 153 and a second heating mechanism 154. The first heating mechanism 153 is embedded in the first holder 151, and serves to heat the first holder 151 to thereby heat the processing target substrate W held by the first holder 151 to a preset temperature. Further, the second heating mechanism 154 is embedded in the second holder 152, and serves to heat the second holder 152 to thereby heat the support substrate S held by the second holder 152 to a preset temperature.

The bonding unit 150 has a moving mechanism 155. The moving mechanism 155 moves the second holder 152 vertically downwards, thus allowing the support substrate S to be brought into contact with the processing target substrate W and pressed on it. Further, the moving mechanism 155 only needs to move the first holder 151 and the second holder 152 relative to each other, and may be configured to move the first holder 151 instead. The moving mechanism 155 includes a base member 156, a pressure vessel 157, a gas supply pipe 158, and a gas source 159. The base member 156 is mounted to a ceiling surface inside a second chamber portion 162 to be described later.

The pressure vessel 157 is formed of, for example, a stainless steel bellows that is expandable and contractible in a vertical direction. A lower end of the pressure vessel 157 is fixed to a top surface of the second holder 152, and an upper end of the pressure vessel 157 is fixed to a bottom surface of the base member 156. One end of the gas supply pipe 158 is connected to the pressure vessel 157 via the base member 156 and a second chamber portion 162 to be described later, and the other end thereof is connected to a gas source 159.

By supplying a gas into the pressure vessel 157 from the gas source 159 through the gas supply pipe 158, the pressure vessel 157 is expanded, so that the second holder 152 is lowered. Accordingly, the support substrate S is brought into contact with the processing target substrate W and pressed. A pressing force for the processing target substrate W and the support substrate S is adjusted by adjusting the pressure of the gas supplied to the pressure vessel 157.

The bonding unit 150 is equipped with a chamber 160, a position adjusting unit 170, a decompressing unit 180, a first imaging unit 191, and a second imaging unit 192.

The chamber 160 is a processing vessel having a sealable inside, and includes a first chamber portion 161 and the second chamber portion 162. The first chamber portion 161 is a cylindrical vessel with an open top, and the first holder 151 and so forth are accommodated therein. Further, the second chamber portion 162 is a cylindrical vessel with an open bottom, and the second holder 152, the pressure vessel 157, and so forth are accommodated therein.

The second chamber portion 162 is configured to be moved up and down in the vertical direction by a non-illustrated elevating mechanism such as an air cylinder. By lowering the second chamber portion 162 with the elevating mechanism and thus bringing it into contact with the first chamber portion 161, a closed space is formed within the chamber 160. Further, a seal member 163 for securing airtightness of the chamber 160 is provided on a contact surface of the second chamber portion 162 with the first chamber portion 161. By way of example, an O-ring is used as the seal member 163.

The position adjusting unit 170 is provided at an outer periphery of the second chamber portion 162 and is configured to move the second holder 152 in a horizontal direction via the second chamber portion 162. The position adjusting unit 170 is plural in number, and these position adjusting units 170 are provided at a plurality of (for example, five) positions on the outer periphery of the second chamber portion 162. Four of the five position adjusting units 170 are used for the movement of the second holder 152 in the horizontal direction, and the other one is used for the rotation of the second holder 152 around the vertical axis.

Each position adjusting unit 170 is equipped with a cam 171 that is in contact with the outer periphery of the second chamber portion 162 and configured to move the second holder 152; and a rotational driving unit 173 configured to rotate the cam 171 via a shaft 172. The cam 171 is disposed eccentrically with respect to a central axis of the shaft 172. By rotating the cam 171 with the rotational driving unit 173, a center position of the cam 171 with respect to the second holder 152 is moved, so that the second holder 152 can be moved in the horizontal direction.

The decompressing unit 180 is provided at, for example, a lower portion of first chamber portion 161, and is configured to decompress the chamber 160. The decompressing unit 180 includes an intake pipe 181 for inhaling an atmosphere within the chamber 160; and an intake device 182, such as a vacuum pump, connected to the intake pipe 181.

The first imaging unit 191 is disposed below the second holder 152, and serves to image the bottom surface (bonding surface Sj) of the support substrate S held by the second holder 152. In addition, the second imaging unit 192 is disposed above the first holder 151, and serves to image the top surface (bonding surface Wj) of the processing target substrate W held by the first holder 151.

The first imaging unit 191 and the second imaging unit 192 are configured to be movable in the horizontal direction by a non-illustrated moving mechanism (not shown), and they advance into the chamber 160 to image the processing target substrate W and the support substrate S before the second chamber portion 162 is lowered. The image data of the first imaging unit 191 and the second imaging unit 192 are transmitted to the control device 90. Each of the first imaging unit 191 and the second imaging unit 192 may be implemented by, by way of non-limiting example, a wide-angle CCD camera.

Figure 13:
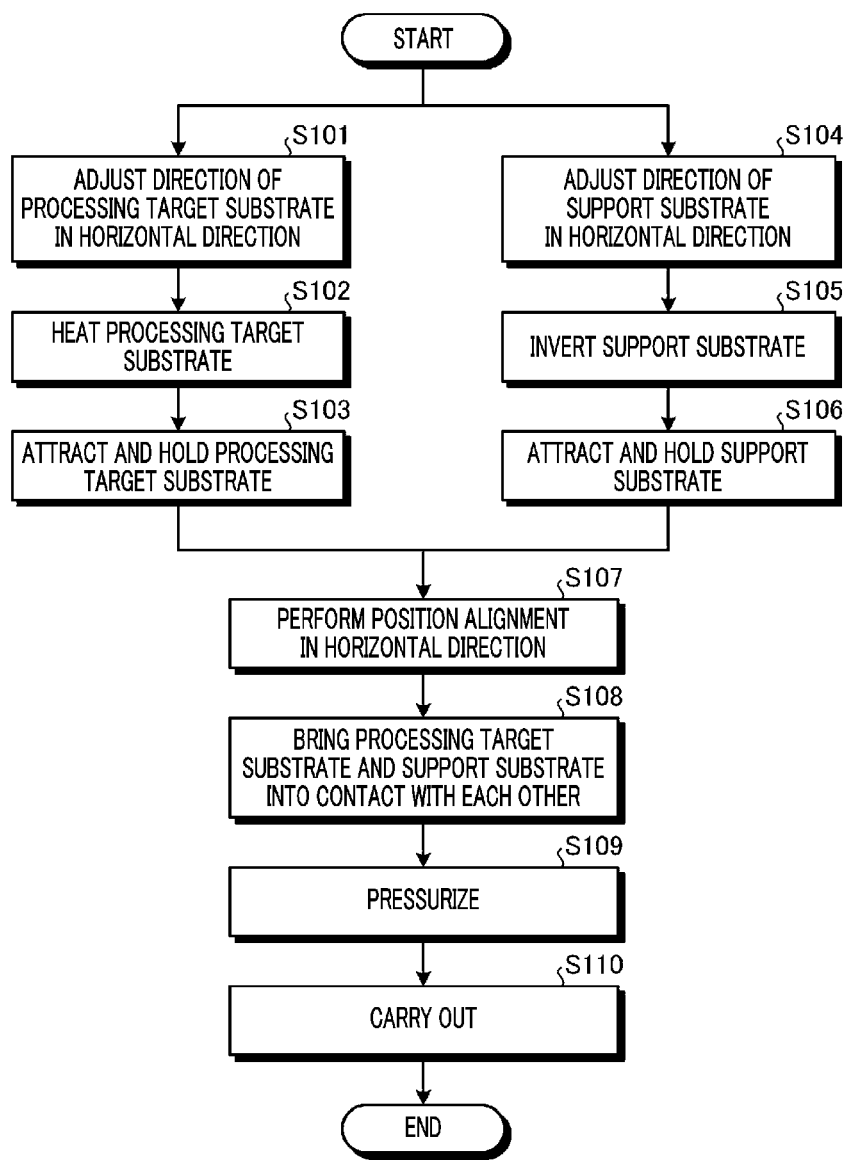
FIG. 13 is a flowchart illustrating a sequence of a bonding method according to the exemplary embodiment.

Now, referring to FIG. 13, an example operation of the bonding apparatus 80 will be explained. If the processing target substrate W is conveyed to the delivery arm 111 of the delivery unit 110 by the second transfer device 21 (see FIG. 1), the delivery arm 111 delivers the processing target substrate W to the supporting pins 112. Then, the processing target substrate W is transferred from the supporting pins 112 to the inverting unit 120 by the first transfer arm 141 of the transfer unit 140.

As for the processing target substrate W transferred to the inverting unit 120, the position of the notch is detected by the detector 122 of the inverting unit 120, and the direction of the processing target substrate W in the horizontal direction is adjusted (process S101). Thereafter, the processing target substrate W is transferred from the inverting unit 120 to the heating unit 130 by the first transfer arm 141 of the transfer unit 140.

The processing target substrate W transferred to the heating unit 130 is heated to a preset temperature by the hot plate 131 of the heating unit 130 (process S102). Thus, bending of the processing target substrate W is reduced. Then, the processing target substrate W is transferred from the heating unit 130 to the first holder 151 of the bonding unit 150 by the first transfer arm 141 of the transfer unit 140 to be attracted to and held by the first holder 151 (process S103). The first holder 151 is heated to a required temperature in advance by the first heating mechanism 153.

Meanwhile, if the support substrate S is conveyed to the delivery arm 111 of the delivery unit 110 by the second transfer device 21 (see FIG. 1), the delivery arm 111 delivers the support substrate S to the supporting pins 112. Then, the support substrate S is transferred from the supporting pins 112 to the inverting unit 120 by the first transfer arm 141 of the transfer unit 140.

As for the support substrate S transferred to the inverting unit 120, the position of the notch is detected by the detector 122 of the inverting unit 120, and the direction of the support substrate S in the horizontal direction is adjusted (process S104). Thereafter, the support substrate S is inverted upside down by the inverting unit 120 (process S105). As a result, the bonding surface Sj of the support substrate S is directed downwards.

Thereafter, the support substrate S is transferred from the inverting unit 120 to the second holder 152 of the bonding unit 150 by the second transfer arm 142 of the transfer unit 140, and is then attracted to and held by the second holder 152 (process S106). The second holder 152 is previously heated to a required temperature by the second heating mechanism 154.

If the carry-in of the processing target substrate W and the support substrate S into the bonding unit 150 is completed, alignment of the processing target substrate W and the support substrate S in the horizontal direction is carried out (process S107). A plurality of reference points are previously formed on the processing target substrate W and the support substrate S. The bonding unit 150 moves the first imaging unit 191 and the second imaging unit 192 shown in FIG. 11 in the horizontal direction to image the reference points of the processing target substrate W and the support substrate S. The bonding unit 150 adjusts the position of the support substrate S in the horizontal direction by using the position adjusting unit 170 such that the position of the reference point included in the image obtained by the first imaging unit 191 and the position of the reference point included in the image obtained by the second imaging unit 192 coincide with each other. That is, by rotating the cam 171 with the rotational driving unit 173 and thus moving the second holder 152 in the horizontal direction via the second chamber portion 162, the position of the support substrate S in the horizontal direction is adjusted.

Thereafter, the bonding unit 150 retreats the first imaging unit 191 and the second imaging unit 192 from the chamber 160, and lowers the second chamber portion 162. Accordingly, the second chamber portion 162 comes into contact with the first chamber portion 161 to form the closed space in the chamber 160. Thereafter, the bonding unit 150 decompresses the chamber 160 by intaking the atmosphere within the chamber 160 by using the decompressing unit 180.

Next, the bonding unit 150 lowers the second holder 152 by using the moving mechanism 155 to bring the processing target substrate W and the support substrate S into contact with each other (process S108). Further, the bonding unit 150 presses the processing target substrate W and the support substrate S by supplying a gas into the pressure vessel 157 to set the inside of the pressure vessel 157 to a required pressure (process S109).

The adhesive G applied to the bonding surface Sj of the support substrate S is softened by heating, and as the support substrate S is pressed against the processing target substrate W at a required pressure for a preset time, the processing target substrate W and the support substrate S are bonded to each other to form the combined substrate T. At this time, since the inside of the chamber 160 is under the decompressed atmosphere, it is possible to suppress generation of bubbles between the processing target substrate W and the support substrate S.

Thereafter, the combined substrate T is transferred from the bonding unit 150 to the delivery unit 110 by the first transfer arm 141 of the transfer unit 140, conveyed to the delivery arm 111 via the supporting pins 112, and then delivered from the delivery arm 111 to the second transfer device 21. The second transfer device 21 then carries out the combined substrate T from the bonding apparatus 80 (process S110).

According to the present exemplary embodiment, the heating unit 130 is provided inside the bonding apparatus 80, and the heating unit 130 heats the processing target substrate W before the bonding unit 150 bonds the processing target substrate W and the support substrate S. As the heating unit 130 heats the processing target substrate W, the bending of the processing target substrate W that occurs in the cooling process is reduced. Thereafter, if the processing target substrate W is attracted to and held by the first holder 151, the precision of the alignment between the processing target substrate W and the support substrate S in the horizontal direction can be improved. Therefore, the bonding precision can be improved.

The combined substrate T carried out from the bonding apparatus 80 is transferred to the transition apparatus 30 by the second transfer device 21. The transition apparatus 30 is equipped with a cooling unit, and the combined substrate T is cooled by this cooling unit.

The combined substrate T immediately after being carried into the transition apparatus 30 is in a state in which the bending thereof is reduced. However, as the cooling proceeds, the combined substrate T may be bent again.

In view of this, in the bonding system 1, when cooling the combined substrate T by the cooling unit, by controlling the cooling unit so as to form a temperature difference in the combined substrate T, the bending of the combined substrate T is controlled.

Figure 14:
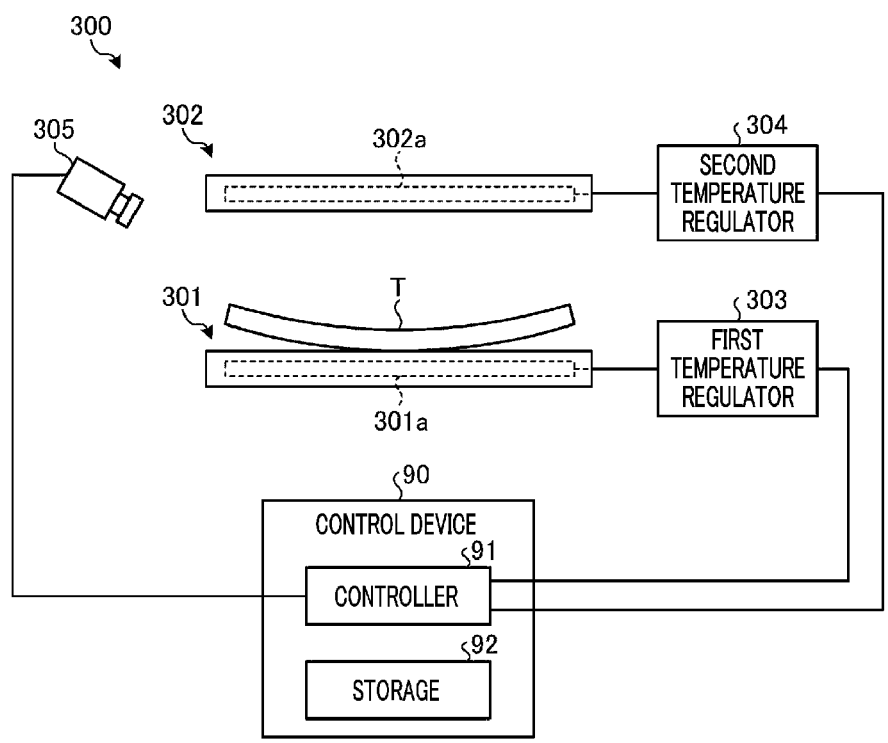
FIG. 14 is a schematic side view illustrating a configuration of a cooling unit according to the exemplary embodiment.

FIG. 14 is a schematic side view illustrating a configuration of the cooling unit according to the exemplary embodiment. As shown in FIG. 14, a cooling unit 300 according to the exemplary embodiment includes a first cooling plate 301, a second cooling plate 302, a first temperature regulator 303, a second temperature regulator 304, and a monitoring unit 305.

The first cooling plate 301 and the second cooling plate 302 are so-called cooling plates. The first cooling plate 301 is disposed under the combined substrate T, and the second cooling plate 302 is disposed above the combined substrate T. That is, the first cooling plate 301 and the second cooling plate 302 are disposed to face each other with the combined substrate T therebetween. Surfaces of the first cooling plate 301 and the second cooling plate 302 facing the combined substrate T are larger than a front surface and a rear surface of the combined substrate T. That is, the first cooling plate 301 and the second cooling plate 302 cool the entire front and rear surfaces of the combined substrate T.

Here, although the combined substrate T is placed on the first cooling plate 301 in the shown example, the combined substrate T may be placed between the first cooling plate 301 and the second cooling plate 302 while being spaced apart from both of the first cooling plate 301 and the second cooling plate 302. In this case, the cooling unit 300 may be equipped with a holder that holds the combined substrate T. The holder may be, for example, three pins that sustain the bottom surface of the combined substrate T, or may be a holder of a type that holds the edge of the combined substrate T.

A temperature regulating element 301a is provided within the first cooling plate 301. Likewise, a temperature regulating element 302a is provided within the second cooling plate 302. The temperature regulating element 301a and the temperature regulating element 302a are, for example, Peltier elements. The temperature regulating element 301a is connected to a first temperature regulator 303, and the temperature regulating element 302a is connected to a second temperature regulator 304. The first temperature regulator 303 and the second temperature regulator 304 are, for example, power supplies, and they supply power to the temperature regulating elements 301a and 302a based on a control by the controller 91. Accordingly, the temperature of a top surface of the first cooling plate 301 (the surface facing the combined substrate T) is reduced by the temperature regulating element 301a. Further, the temperature of a bottom surface of the second cooling plate 302 (the surface facing the combined substrate T) is reduced by the temperature regulating element 302a.

The monitoring unit 305 monitors the bending of the combined substrate T. The monitoring unit 305 may be, by way of non-limiting example, a camera, a laser interferometer, or a laser displacement meter. The monitoring unit 305 transmits bending measurement data to the controller 91.

The controller 91 cools the combined substrate T by using the first cooling plate 301 and the second cooling plate 302 so that a temperature difference is formed between the front surface (an example of a second main surface) and the rear surface (an example of a first main surface) of the combined substrate T. To elaborate, the controller 91 controls the first temperature regulator 303 and the second temperature regulator 304 to set the temperature of the first cooling plate 301 and the temperature of the second cooling plate 302 to be different, thus generating the temperature difference between the front surface and the rear surface of the combined substrate T. Thus, the controller 91 controls the bending of the combined substrate T during the cooling process.

By way of example, the control device 90 may store, in the storage 92, "post-cooling bending information" in which a shape assumed as the shape of the bending of the combined substrate T after being cooled by natural cooling is matched with each type of the combined substrate T. The "shape assumed" may be, for example, information for determining the direction of the bending, that is, whether it is a downwardly protruding bending shape (see FIG. 14) or an upwardly protruding bending shape. In addition, the "shape assumed" may include information upon the degree of bending, for example, planarity, in addition to the direction of the bending. The "type of the combined substrate T" may be, for example, information for identifying the combined substrate T such as a lot number. In addition, the "type of the combined substrate T" may be information including, for example, the material and the thickness of each of the glass substrate Wa, the resin layer Wb, the adhesive G, and the support substrate S.

Further, the control device 90 may store, in the storage 92, control information in which a combination of cooling temperatures of the first cooling plate 301 and the second cooling plate 302 for correcting the combined substrate T into a required bending state is matched with each "shape assumed". The combination of the cooling temperatures of the first cooling plate 301 and the second cooling plate 302 may be obtained by, for example, previous experiment or simulation.

In this case, the controller 91 controls the first temperature regulator 303 and the second temperature regulator 304 according to the post-cooling bending information and the control information stored in the storage 92, whereby the combined substrate T can be corrected into a required bending state (for example, a state with no bending).

As an example, when the "shape assumed" is the downwardly protruding bending shape (see FIG. 14), the controller 91 may control the first temperature regulator 303 and the second temperature regulator 304 so that the cooling temperature for a peripheral portion of the combined substrate T becomes lower than the cooling temperature for a central portion of the combined substrate T. Specifically, the controller 91 may control the first temperature regulator 303 and the second temperature regulator 304 so that the cooling temperature of the second cooling plate 302 is lower than the cooling temperature of the first cooling plate 301. In addition, when the "shape assumed" is the upwardly protruding bending shape, the controller 91 may control the first temperature regulator 303 and the second temperature regulator 304 so that the cooling temperature for the central portion of the combined substrate T becomes lower than the cooling temperature for the peripheral portion of the combined substrate T. Specifically, the controller 91 may control the first temperature regulator 303 and the second temperature regulator 304 so that the cooling temperature of the second cooling plate 302 is lower than the cooling temperature of the first cooling plate 301.

In the present exemplary embodiment, for the sake of easy understanding, the first temperature regulator 303 and the second temperature regulator 304 are controlled according to the post-cooling bending information and the control information. Without being limited thereto, however, the controller 91 may control the first temperature regulator 303 and the second temperature regulator 30 based on information in which a combination of the cooling temperatures of the first cooling plate 301 and the second cooling plate 302 for correcting the combined substrate T into a required bending state is matched with each type of the combined substrate T.

Further, the controller 91 may form the temperature difference in the combined substrate T by controlling the cooling unit 300 based on a change in the bending of the combined substrate T with a lapse of time, which is observed by the monitoring unit 305. For example, the controller 91 may cool the combined substrate T by setting the first cooling plate 301 and the second cooling plate 302 to the same cooling temperature at the beginning of the cooling process. Further, the controller 91 may change the cooling temperatures of the first cooling plate 301 and the second cooling plate 302 according to a change in the bending of the combined substrate T due to the cooling. For example, when the degree of the bending of the combined substrate T falls out of a tolerance range (for example, when a height difference between the central portion and the peripheral portion of the combined substrate T exceeds a threshold value), the controller 91 may set the cooling temperature of the second cooling plate 302 to be lower than the cooling temperature of the first cooling plate 301. In addition, the controller 91 may control the first temperature regulator 303 and the second temperature regulator 304 so that the difference between the cooling temperatures of the first cooling plate 301 and the second cooling plate 302 increases with an increase of the degree of the bending of the combined substrate T.

Here, the bending of the combined substrate T is corrected during the cooling so that the bending of the combined substrate T after being cooled is suppressed. Without being limited thereto, however, the controller 91 may correct the bending of the combined substrate T during the cooling so that the combined substrate T after being cooled has a required bending shape.

In addition, here, the exemplary embodiment has been described for the case where the bending of the combined substrate T is corrected by using the cooling unit 300 when cooling the combined substrate T after being carried out from the bonding apparatus 80. However, without being limited thereto, depending on the type of the adhesive G, the cooled combined substrate T may be carried into the heat treatment apparatus 50 to be subjected to a process of heating the combined substrate T. In this case, when cooling the combined substrate T after being heated by the heat treatment apparatus 50 with the cooling unit 300, the controller 91 may correct the bending of the combined substrate T during the cooling so that the combined substrate T has a required bending shape.

In the bonding system 1 according to the above-described exemplary embodiment, when the heated combined substrate T is cooled by using the cooling unit 300, bending of the combined substrate T is controlled by generating a temperature difference in the combined substrate T. Therefore, according to the bonding system 1 of the exemplary embodiment, it is possible to control the bending of the combined substrate T in which the processing target substrate W and the support substrate S are bonded to each other.

First Modification Example

Figure 15:
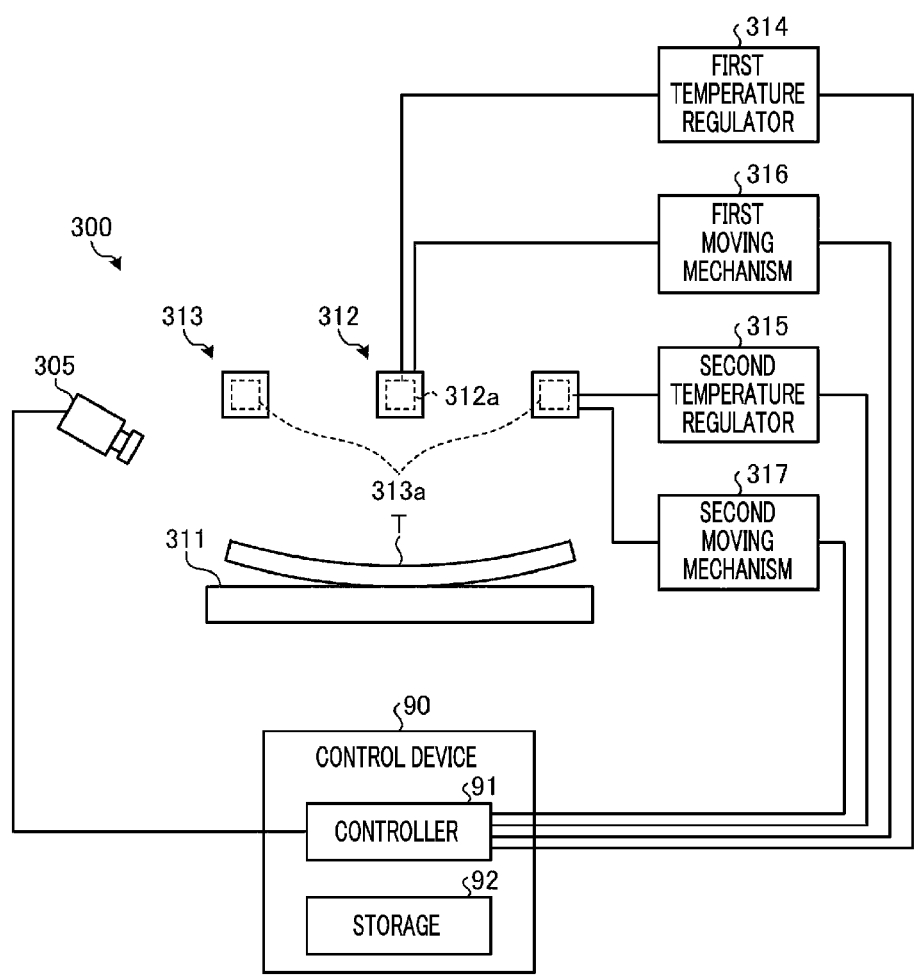
FIG. 15 is a schematic side view illustrating a configuration of a cooling unit according to a first modification example.

FIG. 15 is a schematic side view illustrating a configuration of the cooling unit 300 according to a first modification example. As shown in FIG. 15, the cooling unit 300 according to the first modification example is equipped with a placement plate 311, a first cooling block 312, a second cooling block 313, a first temperature regulator 314, a second temperature regulator 315, a first moving mechanism 316, a second moving mechanism 317, and the monitoring unit 305.

The placement plate 311 is, for example, a plate-shaped member, and the combined substrate T is placed on a top surface thereof. The first cooling block 312 and the second cooling block 313 are disposed above the placement plate 311, and serve to locally cool the front surface of the combined substrate T placed on the placement plate 311. Specifically, the first cooling block 312 cools the central portion of the combined substrate T. Further, the second cooling block 313 is formed to have an annular shape when viewed from the top, and is configured to cool the peripheral portion of the combined substrate T.

A temperature regulating element 312a is provided within the first cooling block 312. Likewise, a temperature regulating element 313a is provided within the second cooling block 313. The temperature regulating element 312a and the temperature regulating element 313a are, for example, Peltier elements. The temperature regulating element 312a is connected to the first temperature regulator 314, and the temperature regulating element 313a is connected to the second temperature regulator 315. The first temperature regulator 314 and the second temperature regulator 315 are, for example, power supplies, and serve to supply power to the temperature regulating elements 312a and 313a based on a control by the controller 91. Accordingly, the temperatures of bottom surfaces of the first cooling block 312 and the second cooling block 313 (the surfaces thereof facing the combined substrate T) are reduced by the temperature regulating element 312a and the temperature regulating element 313a.

The first moving mechanism 316 moves the first cooling block 312 up and down. The second moving mechanism 317 moves the second cooling block 313 up and down.

The controller 91 may locally cool the combined substrate T by using at least one of the first cooling block 312 and the second cooling block 313 to form a temperature difference within the surface of the combined substrate T, thus controlling the bending of the combined substrate T.

As an example, when the combined substrate T is curved in a downwardly protruding shape as shown in FIG. 15, the controller 91 may control the second moving mechanism 317 to lower the second cooling block 313, thus allowing the second cooling block 313 to come into contact with the peripheral portion of the combined substrate T. As a result, the peripheral portion of the combined substrate T is cooled locally, so that the bending of the combined substrate T can be reduced. Further, the controller 91 may not only bring the second cooling block 313 into contact with the peripheral portion of the combined substrate T, but it may also press the peripheral portion of the combined substrate T into contact with the placement plate 311 by using the second cooling block 313. By doing this, the bending of the combined substrate T can be reduced properly.

Further, when the combined substrate T is curved in an upwardly protruding shape, the controller 91 may control the first moving mechanism 316 to lower the first cooling block 312, thus allowing the first cooling block 312 to come into contact with the central portion of the combined substrate T. As a result, the central portion of the combined substrate T is locally cooled, so that the bending of the combined substrate T can be reduced. Furthermore, the controller 91 may not only bring the first cooling block 312 into contact with the central portion of the combined substrate T, but it may also press the central portion of the combined substrate T into contact with the placement plate 311 by using the first cooling block 312. By doing this, the bending of the combined substrate T can be reduced properly.

The controller 91 may determine which one of the first cooling block 312 and the second cooling block 313 is to be used to cool the combined substrate T based on the post-cooling bending information stored in the storage 92. For example, when the bending shape assumed from the post-cooling bending information is a downwardly protruding shape, the controller 91 may control the second moving mechanism 317 to lower the second cooling block 313, thus allowing the second cooling block 313 to come into contact with the peripheral portion of the combined substrate T. Further, when the bending shape assumed from the post-cooling bending information is an upwardly protruding shape, the controller 91 may control the first moving mechanism 316 to lower the first cooling block 312, thus allowing the first cooling block 312 to come into contact with the central portion of the combined substrate T.

The controller 91 may determine which one of the first cooling block 312 and the second cooling block 313 is to be used to cool the combined substrate T based on a change in the bending of the combined substrate T with a lapse of time, which is observed by the monitoring unit 305. For example, when the height of the peripheral portion of the combined substrate T is higher than the height of the central portion and a difference therebetween exceeds a threshold value, the controller 91 may control the second moving mechanism 317 to lower the second cooling block 313, thus allowing the second cooling block 313 to come into contact with the peripheral portion of the combined substrate T. Also, when the height of the central portion of the combined substrate T is higher than the height of the peripheral portion thereof and a difference therebetween exceeds a threshold value, the controller 91 may control the first moving mechanism 316 to lower the first cooling block 312, thus allowing the first cooling block 312 to come into contact with the central portion of the combined substrate T.

Moreover, the controller 91 may cool the combined substrate T by using both the first cooling block 312 and the second cooling block 313. In this case, the controller 91 may set the temperature of the first cooling block 312 and the temperature of the second cooling block 313 to be different from each other so as to form a temperature difference between the central portion and the peripheral portion of the combined substrate T. Specifically, the controller 91 may control the first temperature regulator 314 and the second temperature regulator 315 based on the post-cooling bending information and the control information stored in the storage 92. Further, the controller 91 may control the first temperature regulator 314 and the second temperature regulator 315 based on the change in the bending of the combined substrate T with a lapse of time, which is observed by the monitoring unit 305, thus forming a temperature difference in the combined substrate T.

Here, although the example has been described for the case where the cooling unit 300 is equipped with both the first cooling block 312 and the second cooling block 313, the cooling unit 300 may have only one of the first cooling block 312 and the second cooling block 313.

In addition, the cooling unit 300 may be equipped with a cooling plate instead of the placement plate 311.

In this way, the cooling unit 300 may be equipped with the second cooling block 313 configured to cool the peripheral portion of the combined substrate T. In this case, the controller 91 may form a temperature difference in the combined substrate T by bringing the second cooling block 313 into contact with the peripheral portion of the combined substrate T.

Furthermore, the cooling unit 300 may be equipped with the first cooling block 312 configured to cool the central portion of the combined substrate T. In this case, the controller 91 may form a temperature difference in the combined substrate T by bringing the first cooling block 312 into contact with the central portion of the combined substrate T.

Additionally, the controller 91 may bring the cooling block (the first cooling block 312 or the second cooling block 313) into contact with the combined substrate T and press the combined substrate T by using the cooling block.

Second Modification Example

Figure 16:
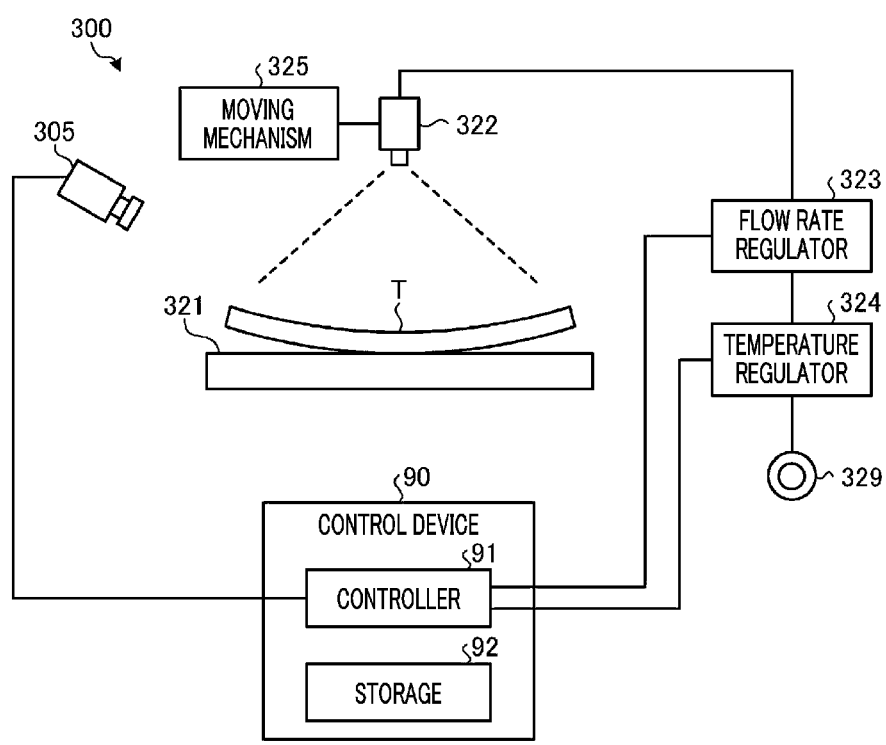
FIG. 16 is a schematic side view illustrating a configuration of a cooling unit according to a second modification example.

FIG. 16 is a schematic side view illustrating a configuration of the cooling unit 300 according to a second modification example. As illustrated in FIG. 16, the cooling unit 300 according to the second modification example includes a placement plate 321, a nozzle 322, a flow rate regulator 323, a temperature regulator 324, a moving mechanism 325, and a monitoring unit 30.

The placement plate 321 is, for example, a plate-shaped member, and the combined substrate T is placed on a top surface thereof. The nozzle 322 is disposed above the placement plate 321 and supplies a cooling gas to the front surface of the combined substrate T placed on the placement plate 321. Specifically, the nozzle 322 is connected to a gas source 329 via the flow rate regulator 323 and the temperature regulator 324. The flow rate regulator 323 regulates the flow rate of the gas supplied from the gas source 329 to the nozzle 322. The temperature regulator 324 regulates the temperature of the gas supplied from the gas source 329 to the nozzle 322. The gas supplied from the gas source 329 may be, by way of non-limiting example, dry air or an inert gas (e.g., nitrogen, etc.). The moving mechanism 325 moves the nozzle 322. As an example, the moving mechanism 325 is capable of moving the nozzle 322 in a horizontal direction and a vertical direction.

In this way, by supplying the cooling gas from the nozzle 322 to the entire front surface of the combined substrate T placed on the placement plate 321 from above the combined substrate T, the controller 91 is capable of forming a temperature difference between the front surface and the rear surface of the combined substrate T.

For example, the controller 91 may form the temperature difference between the front surface and the rear surface of the combined substrate T by controlling at least one of the flow rate regulator 323, the temperature regulator 324 and the moving mechanism 325 based on the post-cooling bending information stored in the storage 92. For instance, with a rise of the degree of bending assumed, the controller 91 may increase the flow rate of the cooling gas supplied from the nozzle 322. Further, with the rise of the degree of bending assumed, the controller 91 may decrease the temperature of the cooling gas supplied from the nozzle 322. In addition, with the rise of the degree of bending assumed, the controller 91 may bring the nozzle 322 closer to the combined substrate T.

Furthermore, the controller 91 may be capable of locally cooling a part of the front surface of the combined substrate T by controlling the moving mechanism 325 to move the position of the nozzle 322 or by controlling the flow rate regulator 323 to adjust the flow rate of the cooling gas discharged from the nozzle 322. In this way, the controller 91 may control the bending of the combined substrate T by forming a temperature difference within the surface of the combined substrate T.

Further, the controller 91 may form the temperature difference between the front surface and the rear surface of the combined substrate T by controlling at least one of the flow rate regulator 323, the temperature regulator 324 and the moving mechanism 325 based on the change in the bending of the combined substrate T with a lapse of time which is observed by the monitoring unit 305. For example, the controller 91 may increase the flow rate of the cooling gas supplied from the nozzle 322 as the degree of bending of the combined substrate T observed by the monitoring unit 305 increases. In addition, the controller 91 may lower the temperature of the cooling gas supplied from the nozzle 322 as the degree of bending of the combined substrate T observed by the monitoring unit 305 increases. Furthermore, the controller 91 may bring the nozzle 322 closer to the combined substrate T as the degree of bending of the combined substrate T observed by the monitoring unit 305 increases.

Here, the example has been described for the case where the cooling gas is supplied to the front surface of the combined substrate T from the nozzle 322 disposed above the combined substrate T. However, without being limited thereto, the cooling unit 300 may supply the cooling gas to the rear surface of the combined substrate T from the nozzle 322 disposed below the combined substrate T. In this case, the cooling unit 300 may have, for example, a gripper configured to grip an edge portion of the combined substrate T instead of the placement plate 321.

Moreover, although the example has been described for the case where the cooling unit 300 is equipped with the placement plate 321, the cooling unit 300 may be equipped with a cooling plate instead of the placement plate 321.

In this way, the cooling unit 300 may include the nozzle 322 configured to supply the cooling gas to either one of the front surface and the rear surface of the combined substrate T. In this case, the controller 91 may form the temperature difference between the front surface and the rear surface of the combined substrate T by controlling at least one of the flow rate and temperature of the cooling gas supplied from the nozzle 322 and the position of the nozzle 322.

Third Modification Example

Figure 17:
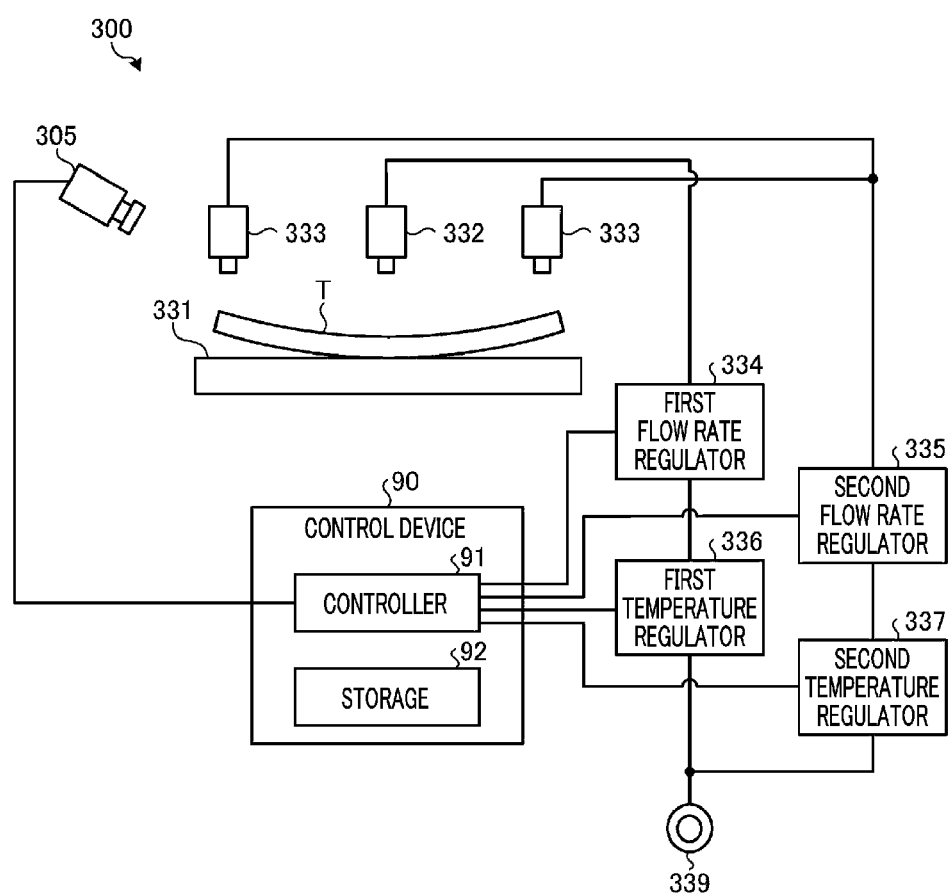
FIG. 17 is a schematic side view illustrating a configuration of a cooling unit according to a third modification example.

FIG. 17 is a schematic side view illustrating a configuration of the cooling unit 300 according to a third modification example. As depicted in FIG. 17, the cooling unit 300 according to the third modification example includes a placement plate 331, a first nozzle 332, a plurality of second nozzles 333, a first flow rate regulator 334, a second flow rate regulator 335, a first temperature regulator 336, a second temperature regulator 337, and a monitoring unit 305.

The placement plate 331 is, for example, a plate-shaped member, and the combined substrate T is placed on a top surface thereof. The first nozzle 332 and the plurality of second nozzles 333 are disposed above the placement plate 331 and locally cool the front surface of the combined substrate T placed on the placement plate 331. Specifically, the first nozzle 332 cools the central portion of the combined substrate T. Further, the plurality of second nozzles 333 cool the peripheral portion of the combined substrate T.

The first nozzle 332 is connected to a gas source 339 via the first flow rate regulator 334 and the first temperature regulator 336. The first flow rate regulator 334 adjusts the flow rate of the gas supplied from the gas source 339 to the first nozzle 332. The first temperature regulator 336 controls the temperature of the gas supplied from the gas source 339 to the first nozzle 332. The gas supplied from the gas source 339 may be, for example, dry air or an inert gas (e.g., nitrogen, etc.).

The plurality of second nozzles 333 are connected to the gas source 339 via the second flow rate regulator 335 and the second temperature regulator 337. The second flow rate regulator 335 adjusts the flow rate of the gas supplied from the gas source 339 to the plurality of second nozzles 333. The second temperature regulator 337 adjusts the temperature of the gas supplied from the gas source 339 to the plurality of second nozzles 333.

The controller 91 is capable of forming a temperature difference within the surface of the combined substrate T by supplying a cooling gas or a heating gas from the first nozzle 332 and the plurality of second nozzles 333 to the front surface of the combined substrate T placed on the placement plate 321 from above the combined substrate T.

For example, it is assumed that the combined substrate T is curved in a downwardly protruding shape as shown in FIG. 17. In this case, the controller 91 may control the first temperature regulator 336 to supply the heating gas from the first nozzle 332 to the central portion of the combined substrate T, and may also control the second temperature regulator 337 to supply the cooling gas from the plurality of second nozzles 333 to the peripheral portion of the combined substrate T. Thus, the bending of the combined substrate T can be reduced.

In addition, it is assumed that the combined substrate T is curved in an upwardly protruding shape. In this case, the controller 91 may control the first temperature regulator 336 to supply the cooling gas from the first nozzle 332 to the central portion of the combined substrate T, and may also control the second temperature regulator 337 to supply the heating gas from the plurality of second nozzles 333 to the peripheral portion of the combined substrate T. Thus, the bending of the combined substrate T can be reduced.

The controller 91 may decide the temperature of the gas supplied from the first nozzle 332 and the plurality of second nozzles 333 based on the post-cooling bending information stored in the storage 92. Further, the controller 91 may decide the temperature of the gas supplied from the first nozzle 332 and the plurality of second nozzles 333 based on the change in the bending of the combined substrate T with the lapse of time which is observed by the monitoring unit 305.

Here, the example has been described for the case where the first nozzle 332 and the plurality of second nozzles 333 are disposed above the combined substrate T. Without being limited thereto, however, the first nozzle 332 and the plurality of second nozzles 333 may be disposed below the combined substrate T. In this case, if the combined substrate T is curved in a downwardly protruding shape, the controller 91 supplies the cooling gas from the first nozzle 332 to the central portion of the combined substrate T while supplying the heating gas from the plurality of second nozzles 333 to the peripheral portion of the combined substrate T. Further, if the combined substrate T is curved in an upwardly protruding shape, the controller 91 supplies the heating gas from the first nozzle 332 to the central portion of the combined substrate T while supplying the cooling gas from the plurality of second nozzles 333 to the peripheral portion of the combined substrate T. Further, in case that the first nozzle 332 and the plurality of second nozzles 333 are disposed below the combined substrate T, the cooling unit 300 may be equipped with, for example, a gripper configured to grip an edge portion of the combined substrate T instead of the placement plate 321.

The cooling unit 300 may be equipped with a cooling plate instead of the placement plate 331.

As stated above, the cooling unit 300 may include a plurality of nozzles (here, the first nozzle 332 and the plurality of second nozzles 333) for supplying a gas of a predetermined temperature to different positions within the surface of the combined substrate T. In this case, the controller 91 may form a temperature difference within the surface of the combined substrate T by controlling the temperature of the gas supplied from the plurality of nozzles.

Fourth Modification Example

Figure 18:
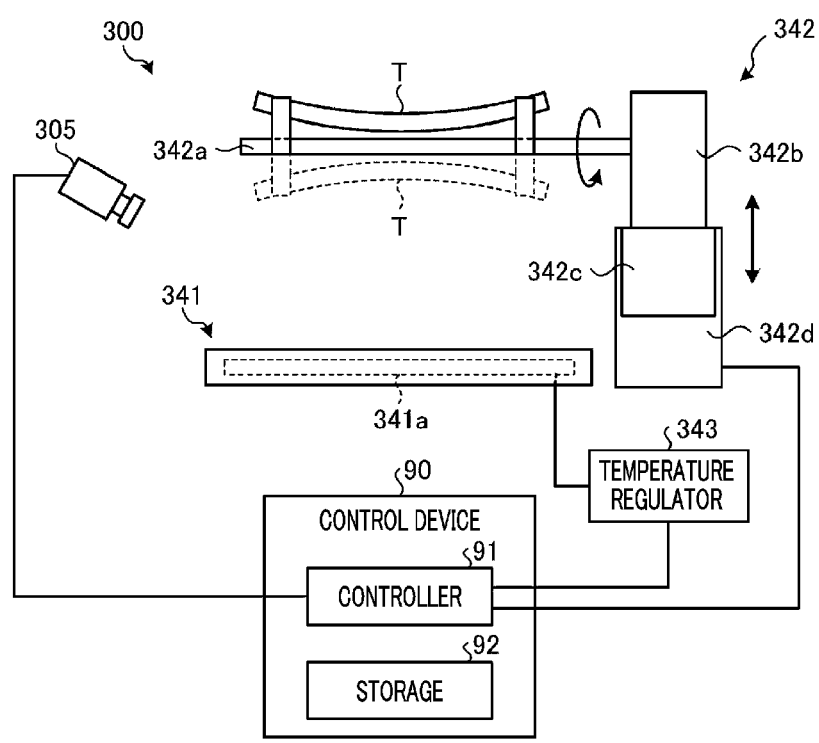
FIG. 18 is a schematic side view illustrating a configuration of a cooling unit according to a fourth modification example.

FIG. 18 is a schematic side view illustrating a configuration of the cooling unit 300 according to a fourth modification example. As shown in FIG. 18, the cooling unit 300 according to the fourth modification example includes a cooling plate 341, an inverting unit 342, a temperature regulator 343, and the monitoring unit 305.

The cooling plate 341 is a so-called cooling plate. A temperature regulating element 341a is provided within the cooling plate 341. The temperature regulating element 341a is, for example, a Peltier element. The temperature regulating element 341a is connected to the temperature regulator 343. The temperature regulator 343 is, for example, a power supply, and it supplies power to the temperature regulating element 341a based on a control by the controller 91. As a result, the temperature of a top surface of the cooling plate 341 (the surface facing the combined substrate T) is reduced by the temperature regulating element 341a.

The inverting unit 342 includes a holding arm 342a configured to hold the combined substrate T. The holding arm 342a is disposed above the cooling plate 341. Further, the inverting unit 342 includes a first driving unit 342b. The first driving unit 342b includes a motor or the like and serves to rotate the holding arm 342a about a horizontal axis. Provided below the first driving unit 342b is a second driving unit 342c including, for example, a motor. The second driving unit 342c moves the first driving unit 342b in a vertical direction along a supporting column 342d. By the first driving unit 342b and the second driving unit 342c, the holding arm 342a can be rotated about the horizontal axis and, also, can be moved in the vertical direction.

The controller 91 controls the second transfer device 21 to carry the combined substrate T taken out from the bonding apparatus 80 into the cooling unit 300. At this time, the controller 91 may determine whether to place the combined substrate T on the cooling plate 341 or deliver the combined substrate T to the holding arm 342a based on the shape of the bending assumed by the post-cooling bending information stored in the storage 92.

For example, when it is assumed that the combined substrate T is curved in a downwardly protruding shape, the controller 91 may deliver the combined substrate T to the holding arm 342a. In this case, the controller 91 may control the inverting unit 342 to rotate the holding arm 342a about the horizontal axis, thus allowing the combined substrate T to be inverted so that the front surface of the combined substrate T (that is, the rear surface of the combined substrate T after being inverted) may face the cooling plate 341. Then, the controller 91 controls the inverting unit 342 to lower the holding arm 342a, thus allowing the inverted combined substrate T to be placed on the cooling plate 341 so that the combined substrate T may be cooled by the cooling plate 341.

Meanwhile, when it is assumed that the combined substrate T is curved in an upwardly protruding shape, the controller 91 places the combined substrate T on the cooling plate 341, without inverting it by the inverting unit 342, so that the combined substrate T may be cooled by the cooling plate 341.

Further, after starting the cooling of the combined substrate T by placing the combined substrate T carried into the cooling unit 300 on the cooling plate 341, the controller 91 may perform the inversion of the combined substrate T by the inverting unit 342 based on the change in the bending of the combined substrate T with the lapse of time, which is observed by the monitoring unit 305. By way of example, when the degree of bending exceeds a threshold value, for example, when a difference between the height of the central portion of the combined substrate T and the height of the peripheral portion thereof exceeds a threshold value, the controller 91 controls the inverting unit 342 to invert the combined substrate T. Then, the controller 91 may place the inverted combined substrate T on the cooling plate 341 again to cool the combined substrate T by the cooling plate 341.

As described above, the cooling unit 300 may include the cooling plate 341; and the inverting unit 342 configured to invert the combined substrate T. In this case, the controller 91 may form a temperature difference between the front surface and the rear surface of the combined substrate T by placing the combined substrate T on the cooling plate 341 after inverting the combined substrate T by the inverting unit 342 so that a predetermined one of the front surface and the rear surface of the combined substrate T faces the cooling plate 341.

Fifth Modification Example

Figure 19:
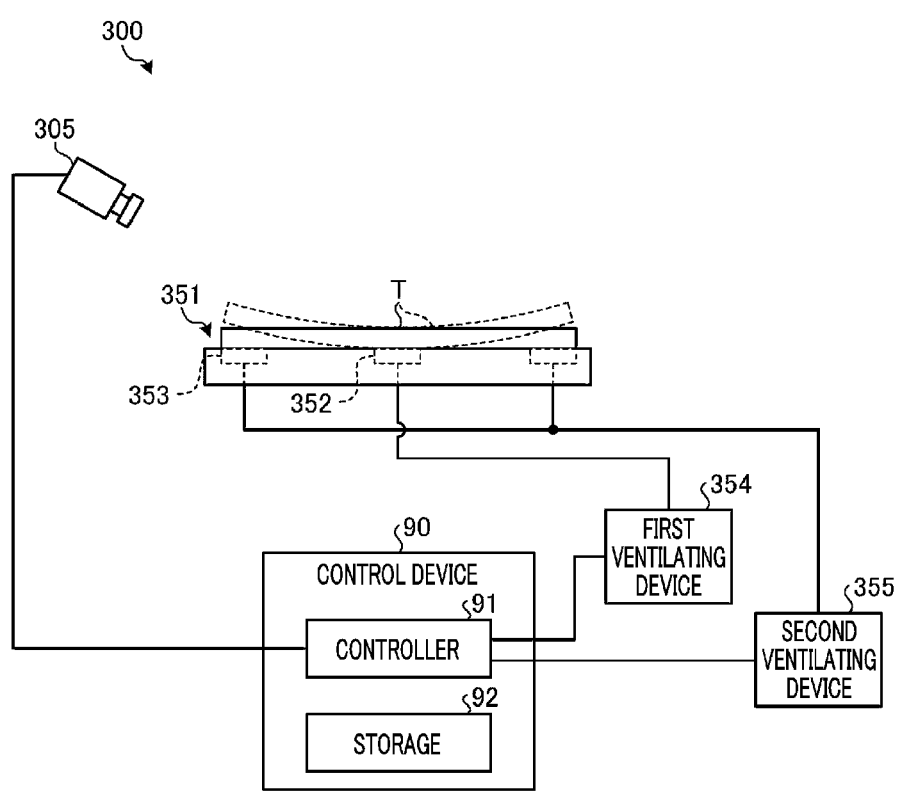
FIG. 19 is a schematic side view illustrating a configuration of a cooling unit according to a fifth modification example.

FIG. 19 is a schematic side view illustrating a configuration of the cooling unit 300 according to a fifth modification example. As depicted in FIG. 19, the cooling unit 300 according to the fifth modification example includes a cooling plate 351, a first attracting unit 352, a second attracting unit 353, a first ventilating device 354, a second ventilating device 355, and the monitoring unit 305.

The cooling plate 351 is a so-called cooling plate. Although not shown herein, a temperature regulating element is provided within the cooling plate 351, and the temperature of this temperature regulating element is adjusted by a non-illustrated temperature regulator.

The first attracting unit 352 and the second attracting unit 353 are disposed in the cooling plate 351, for example. The first attracting unit 352 is provided at a position corresponding to the central portion of the combined substrate T. Further, the second attracting unit 353 is formed to have, for example, an annular shape when viewed from the top, and is provided at a position facing the peripheral portion of the combined substrate T. The first attracting unit 352 is connected to the first ventilating device 354, and attracts the central portion of the combined substrate T by using a suction force generated by the first ventilating device 354. The second attracting unit 353 is connected to the second ventilating device 355, and attracts the peripheral portion of the combined substrate T by using a suction force generated by the second ventilating device 355.

The controller 91 may perform the cooling by the cooling plate 351 while attracting the combined substrate T by controlling the first ventilating device 354 or the second ventilating device 355 according to the shape of the bending assumed by the post-cooling bending information stored in the storage 92.

By way of example, when it is assumed that the combined substrate T is curved in a downwardly protruding shape, the controller 91 may cool the combined substrate T by using the cooling plate 351 while attracting the peripheral portion of the combined substrate T with the second attracting unit 353 by controlling the second ventilating device 355.

Further, when it is assumed that the combined substrate T is curved in an upwardly protruding shape, the controller 91 may cool the combined substrate T by using the cooling plate 351 while attracting the central portion of the combined substrate T with the first attracting unit 352 by controlling the first ventilating device 354.

In addition, the controller 91 may determine which one of the first attracting unit 352 and the second attracting unit 353 is to be used to attract the combined substrate T based on the change in the bending of the combined substrate T with the lapse of time, which is observed by the monitoring unit 305.

Here, although the example has been described for the case where the cooling unit 300 is equipped with both the first attracting unit 352 and the second attracting unit 353, the cooling unit 300 may be equipped with only one of the first attracting unit 352 and the second attracting unit 353.

As stated above, the cooling unit 300 may be equipped with an attracting unit (the first attracting unit 352 or the second attracting unit 353) configured to attract the peripheral portion or the central portion of the combined substrate T. In this case, the controller 91 may cool the combined substrate T while attracting the peripheral portion or the central portion of the combined substrate T by using the attracting unit.

Additionally, the first attracting unit 352 and the second attracting unit 353 may be provided in the cooling unit 300 according to the above-described embodiment or the cooling units 300 according to the first to fourth modification examples.

As described above, a bonding apparatus (as an example, the bonding apparatus 80) according to the exemplary embodiment includes a first holder (as an example, the first holder 151), a second holder (as an example, the second holder 152), and a moving mechanism (for example, the moving mechanism 155). The first holder attracts and holds a first substrate (as an example, the processing target substrate W). The second holder attracts and holds a second substrate (as an example, the support substrate S). The moving mechanism moves the first holder and the second holder relative to each other. In the bonding apparatus according to the exemplary embodiment, a combined substrate (as an example, the combined substrate T) is formed by bringing the first substrate and the second substrate into contact with each other by using the moving mechanism. Further, the bonding apparatus includes a heating unit (the heating unit 130 or the heat treatment apparatus 50), a cooling unit (as an example, cooling unit 300), and a controller (as an example, the controller 91). The heating unit heats the first and second substrates, or the combined substrate. The cooling unit cools the heated combined substrate. The controller controls the cooling unit. The controller controls bending of the combined substrate by controlling the cooling unit to form a temperature difference in the combined substrate.

Thus, according to the bonding apparatus of the exemplary embodiment, it is possible to control the bending of the combined substrate in which the first substrate and the second substrate are bonded to each other.

It should be considered that embodiment disclosed this time is not restrictive by an illustration in all points. Indeed, the above-described embodiment may be implemented in various forms. In addition, said embodiment may omit, substitute, and change in various forms, without deviating from the attached claim and the meaning.

According to the exemplary embodiment, it is possible to control the bending of the combined substrate in which the first substrate and the second substrate are bonded to each other.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A bonding method including attracting and holding a first substrate by using a first holder; attracting and holding a second substrate by using a second holder; and forming a combined substrate by moving the first holder and the second holder relative to each other to bring the first substrate and the second substrate into contact with each other, the bonding method comprising:
   heating the first substrate and the second substrate or the combined substrate; and
   cooling the heated combined substrate by using a cooling unit,
   wherein, in the cooling, bending of the combined substrate is controlled by forming a temperature difference in the combined substrate, and
   in the cooling, the temperature difference is formed between a first main surface of the combined substrate and a second main surface of the combined substrate, the second main surface being opposite to the first main surface,
   wherein the cooling unit comprises a cooling plate and an inverting unit configured to invert the combined substrate, and
   in the cooling, the temperature difference is formed between the first main surface and the second main surface by controlling the inverting unit to invert the combined substrate to allow a predetermined one of the first main surface and the second main surface to face the cooling plate, and then, by placing the combined substrate on the cooling plate.

2. The bonding method of claim 1,
   wherein the cooling unit comprises a first cooling plate facing the first main surface of the combined substrate; and a second cooling plate facing the second main surface of the combined substrate, and
   in the cooling, the temperature difference is formed between the first main surface and the second main surface by setting a temperature of the first cooling plate and a temperature of the second cooling plate to be different from each other.

3. The bonding method of claim 1,
   wherein the cooling unit comprises a nozzle configured to supply a cooling gas to either one of the first main surface and the second main surface of the combined substrate, and
   in the cooling, the temperature difference is formed between the first main surface and the second main surface by controlling at least one of a flow rate and a temperature of the cooling gas supplied from the nozzle or a position of the nozzle.

4. The bonding method of claim 1,
   wherein, in the cooling, the temperature difference is further formed within a surface of the combined substrate.

5. The bonding method of claim 4,
   wherein the cooling unit further comprises a cooling block configured to cool a peripheral portion of the combined substrate, and
   in the cooling, the temperature difference is formed within the surface of the combined substrate by bringing the cooling block into contact with the peripheral portion of the combined substrate.

6. The bonding method of claim 4,
   wherein the cooling unit further comprises a cooling block configured to cool a central portion of the combined substrate, and in the cooling, the temperature difference is formed within the surface of the combined substrate by bringing the cooling block into contact with the central portion of the combined substrate.

7. The bonding method of claim 5,
wherein, in the cooling, the cooling block is brought into contact with the combined substrate, and the combined substrate is pressed by using the cooling block.

8. The bonding method of claim 4,
wherein the cooling unit further comprises multiple nozzles configured to supply a gas of a preset temperature to different positions within the surface of the combined substrate, and
in the cooling, the temperature difference is formed within the surface of the combined substrate by controlling the temperature of the gas supplied from the multiple nozzles.

9. The bonding method of claim 1,
wherein the cooling unit further comprises an attracting unit configured to attract a peripheral portion or a central portion of the combined substrate, and
in the cooling, the combined substrate is cooled while attracting the peripheral portion or the central portion of the combined substrate by using the attracting unit.

10. The bonding method of claim 1,
wherein the cooling unit further comprises a monitoring unit configured to monitor the bending of the combined substrate, and
in the cooling, the temperature difference is formed within the combined substrate by controlling the cooling unit based on a change in the bending of the combined substrate measured by the monitoring unit.

11. A bonding apparatus, including a first holder configured to attract and hold a first substrate; a second holder configured to attract and hold a second substrate; and a moving mechanism configured to move the first holder and the second holder relative to each other, configured to form a combined substrate by bringing the first substrate and the second substrate into contact with each other with the moving mechanism, the bonding apparatus comprising:

a heating unit configured to heat the first substrate and the second substrate or the combined substrate;

a cooling unit configured to cool the heated combined substrate; and a controller configured to control the cooling unit, wherein the controller controls bending of the combined substrate by controlling the cooling unit to form a temperature difference between a first main surface of the combined substrate and a second main surface of the combined substrate, the second main surface being opposite to the first main surface, wherein the cooling unit comprises a cooling plate and an inverting unit configured to invert the combined substrate, and wherein the controller controls the inverting unit to invert the combined substrate to allow a predetermined one of the first main surface and the second main surface to face the cooling plate, and then, place the combined substrate on the cooling plate such that the temperature difference is formed between the first main surface and the second main surface.

* * * * *